(12) United States Patent
Kim et al.

(10) Patent No.: US 10,083,965 B2
(45) Date of Patent: Sep. 25, 2018

(54) SEMICONDUCTOR DEVICE HAVING FIN-TYPE PATTERNS

(71) Applicant: Samsung Electronics Co., Ltd., Suwon-si (KR)

(72) Inventors: Ki Hwan Kim, Suwon-si (KR); Gi Gwan Park, Seoul (KR); Jung Gun You, Hwaseong-si (KR); Dong Suk Shin, Ansan-si (KR); Hyun Yul Choi, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/850,183

(22) Filed: Dec. 21, 2017

(65) Prior Publication Data
US 2018/0114791 A1 Apr. 26, 2018

Related U.S. Application Data

(62) Division of application No. 15/368,723, filed on Dec. 5, 2016, now Pat. No. 9,871,042.

(30) Foreign Application Priority Data

Dec. 3, 2015 (KR) .................. 10-2015-0171393
Jan. 28, 2016 (KR) .................. 10-2016-0010593

(51) Int. Cl.
*H01L 27/00* (2006.01)
*H01L 27/092* (2006.01)
(Continued)

(52) U.S. Cl.
CPC ........ *H01L 27/0924* (2013.01); *H01L 21/845* (2013.01); *H01L 27/0207* (2013.01);
(Continued)

(58) Field of Classification Search
CPC .............. H01L 29/785; H01L 27/0886; H01L 27/0924; H01L 21/845; H01L 27/1211;
(Continued)

(56) References Cited

U.S. PATENT DOCUMENTS 8,610,181 B2 12/2013 Guillorn et al.
8,987,827 B2 3/2015 Montanini et al.
(Continued)

*Primary Examiner* — Ngan Ngo
(74) *Attorney, Agent, or Firm* — Muir Patent Law, PLLC

(57) ABSTRACT

The semiconductor device includes a substrate comprising first and second regions, in the first region, first and second gate electrodes formed parallel to each other on the substrate, and being spaced apart from each other by a first distance, in the second region, third and fourth gate electrodes formed parallel to each other on the substrate, and being spaced apart from each other by a second distance which is greater than the first distance, in the first region, a first recess formed on the substrate between the first and second gate electrodes, in the second region, a second recess formed on the substrate between the third and fourth gate electrodes, a first epitaxial source/drain filling the first recess and a second epitaxial source/drain filling the second recess, wherein an uppermost portion of an upper surface of the first epitaxial source/drain is higher than an uppermost portion of an upper surface of the second epitaxial source/drain.

9 Claims, 15 Drawing Sheets

(51) Int. Cl.
*H01L 21/84* (2006.01)
*H01L 27/088* (2006.01)
*H01L 27/12* (2006.01)
*H01L 29/06* (2006.01)
*H01L 29/08* (2006.01)
*H01L 29/165* (2006.01)
*H01L 29/167* (2006.01)
*H01L 29/417* (2006.01)
*H01L 29/45* (2006.01)
*H01L 29/78* (2006.01)
*H01L 27/02* (2006.01)

(52) U.S. Cl.
CPC ...... *H01L 27/0886* (2013.01); *H01L 27/1211* (2013.01); *H01L 29/0649* (2013.01); *H01L 29/0847* (2013.01); *H01L 29/165* (2013.01); *H01L 29/167* (2013.01); *H01L 29/41766* (2013.01); *H01L 29/41783* (2013.01); *H01L 29/41791* (2013.01); *H01L 29/456* (2013.01); *H01L 29/785* (2013.01); *H01L 29/7848* (2013.01)

(58) Field of Classification Search
CPC ........... H01L 29/41791; H01L 27/0207; H01L 29/41783
See application file for complete search history.

(56) References Cited

U.S. PATENT DOCUMENTS

| | | | |
|---|---|---|---|
| 9,006,835 B2 | 4/2015 | Kronholz et al. | |
| 9,012,999 B2 | 4/2015 | Liu et al. | |
| 9,018,712 B2 | 4/2015 | He | |
| 9,087,921 B2 | 7/2015 | Cheng et al. | |
| 9,117,692 B2 | 8/2015 | Park et al. | |
| 2011/0230027 A1* | 9/2011 | Kim | H01L 21/26586 438/285 |
| 2013/0234250 A1* | 9/2013 | Lin | H01L 21/823431 257/355 |
| 2013/0316535 A1 | 11/2013 | Shin et al. | |
| 2014/0001561 A1 | 1/2014 | Cheng et al. | |
| 2015/0115373 A1* | 4/2015 | Yu | H01L 21/823418 257/401 |
| 2015/0155281 A1 | 6/2015 | Chuang et al. | |
| 2015/0206946 A1 | 7/2015 | Chen et al. | |
| 2015/0214223 A1 | 7/2015 | Tsai et al. | |
| 2015/0270342 A1 | 9/2015 | Tsai et al. | |
| 2015/0279935 A1 | 10/2015 | Xie et al. | |
| 2015/0279963 A1 | 10/2015 | Xie et al. | |
| 2015/0279964 A1 | 10/2015 | Duriez et al. | |
| 2015/0279972 A1 | 10/2015 | Xie et al. | |
| 2015/0287595 A1 | 10/2015 | Wei et al. | |
| 2015/0287647 A1 | 10/2015 | Riley et al. | |
| 2016/0087053 A1* | 3/2016 | Kim | H01L 29/41783 257/369 |
| 2016/0365347 A1* | 12/2016 | Bao | H01L 27/0924 |
| 2017/0125307 A1 | 5/2017 | Lee et al. | |
| 2017/0141228 A1* | 5/2017 | Hsu | H01L 29/66636 |
| 2017/0186871 A1 | 6/2017 | Wu et al. | |
| 2017/0194215 A1 | 7/2017 | Ching et al. | |
| 2017/0194432 A1* | 7/2017 | Maeda | H01L 29/0692 |
| 2017/0365716 A1* | 12/2017 | Chung | H01L 29/7848 |
| 2018/0122826 A1* | 5/2018 | Yamamoto | H01L 21/76283 |

* cited by examiner

SEMICONDUCTOR DEVICE HAVING FIN-TYPE PATTERNS

CROSS-REFERENCE TO RELATED APPLICATION

This application is a divisional of U.S. application Ser. No. 15/368,723 filed Dec. 5, 2016, which claims priority to Korean Patent Application No. 10-2015-0171393 filed on Dec. 3, 2015, and Korean Patent Application No. 10-2016-0010593 filed on Jan. 28, 2016, in the Korean Intellectual Property Office, and all the benefits accruing therefrom under 35 U.S.C. 119, the contents of each of which in their entirety are herein incorporated by reference.

BACKGROUND

1. Technical Field

The present disclosure relates to a semiconductor device.

2. Description of the Related Art

As one of scaling technologies to increase the density of semiconductor devices, a multi-gate transistor has been suggested, in which silicon bodies in a fin or nanowire shape are formed on a substrate, with gates then being formed on surfaces of the silicon bodies.

Such a multi-gate transistor allows easy scaling, as it uses a three-dimensional channel. Further, current control capability can be enhanced without increasing gate length of the multi-gate transistor. Furthermore, it is possible to effectively suppress short channel effect (SCE) which is a phenomenon that the electric potential of the channel region is influenced by the drain voltage.

SUMMARY

It is one technical object of the present disclosure to provide a semiconductor device with improved operating characteristics.

The objects according to the present disclosure are not limited to those set forth above and objects other than those set forth above will be clearly understood to a person skilled in the art from the following description.

According to an aspect of the present inventive concept, there is provided a semiconductor device, comprising a substrate comprising first and second regions, in the first region, first and second gate electrodes extending parallel to each other on the substrate, and being spaced apart from each other by a first distance, in the second region, third and fourth gate electrodes extending parallel to each other on the substrate, and being spaced apart from each other by a second distance which is greater than the first distance, in the first region, a first recess formed on the substrate between the first and second gate electrodes, in the second region, a second recess formed on the substrate between the third and fourth gate electrodes, a first epitaxial source/drain filling the first recess and a second epitaxial source/drain filling the second recess, wherein an uppermost portion of an upper surface of the first epitaxial source/drain is higher than an uppermost portion of an upper surface of the second epitaxial source/drain.

According to another aspect of the present inventive concept, there is provided a semiconductor device, comprising a substrate comprising first to fourth regions, in the first region, first and second gate electrodes extending parallel to each other on the substrate, and being spaced apart from each other by a first distance, in the second region, third and fourth gate electrodes extending parallel to each other on the substrate, and being spaced apart from each other by a second distance which is different from the first distance, in the third region, fifth and sixth gate electrodes extending parallel to each other on the substrate, and being spaced apart from each other by the first distance, in the fourth region, seventh and eighth gate electrodes extending parallel to each other on the substrate, and being spaced apart from each other by the second distance, in the first region, a first recess formed on the substrate between the first and second gate electrodes, in the second region, a second recess formed on the substrate between the third and fourth gate electrodes, in the third region, a third recess formed on the substrate between the fifth and sixth gate electrodes, in the fourth region, a fourth recess formed on the substrate between the seventh and eighth gate electrodes and first to fourth epitaxial source/drains filling the first to fourth recesses, respectively, wherein heights of upper surfaces of the first and second epitaxial source/drains are different from each other, and heights of upper surfaces of the third and fourth epitaxial source/drains are equal to each other.

According to still another aspect of the present inventive concept, there is provided a semiconductor device, comprising a substrate comprising first and second regions, in the first and second regions, first and second fin-type patterns protruding from the substrate, respectively, a first gate electrode intersecting the first fin-type pattern on the first fin-type pattern, a second gate electrode intersecting the second fin-type pattern on the second fin-type pattern, a first epitaxial source/drain formed on either side of the first gate electrode and a second epitaxial source/drain formed on either side of the second gate electrode, wherein a width of the first epitaxial source/drain is less than that of the second epitaxial source/drain, and an upper surface of the first epitaxial source/drain is higher than an upper surface of the second epitaxial source/drain.

According to still another aspect of the present inventive concept, there is provided a semiconductor device, comprising a substrate comprising first to third regions, first to third gate electrodes formed in the first to third regions, respectively, a first epitaxial source/drain formed on either side of the first gate electrode, a second epitaxial source/drain formed on either side of the second gate electrode and a third epitaxial source/drain formed on either side of the third gate electrode, wherein a width of the first epitaxial source/drain is less than that of the second epitaxial source/drain, a width of the second epitaxial source/drain is less than that of the third epitaxial source/drain, an upper surface of the first epitaxial source/drain is higher than an upper surface of the second epitaxial source/drain, and an upper surface of the second epitaxial source/drain is higher than an upper surface of the third epitaxial source/drain.

According to an embodiment of the present disclosure, a semiconductor device comprises a substrate comprising a first and a second fin-type active patterns, a first and a second gate electrodes formed on the first and second fin-type active patterns respectively, a first source/drain pattern formed between the first and second fin-type active patterns, gate insulator layers formed between the first and second gate electrodes and the first and second fin-type active patterns respectively, and gate spacers formed between the first and second gate electrodes and the first source/drain pattern, wherein the center portion of the top surface of the first source/drain pattern is lower than edge portions of the top surface of the first source/drain pattern, wherein a depth of the center portion of the first source/drain pattern is less than 60% and more than 10% of the height of the first source/drain pattern, wherein the height of the first source/drain pattern is a vertical distance between a lowest point of the lower surface of the first source/drain pattern and a highest point of the upper surface of the first source/drain pattern in a cross-sectional view, wherein the depth of the center portion is a vertical distance between a lowest point of the center portion of the upper surface of the first source/drain pattern and a highest point of the upper surface of the first source/drain pattern in a cross-sectional view.

According to an embodiment of the present disclosure, a semiconductor device comprises a first and a second fin-type active patterns formed on a substrate, a first and a second gate electrodes formed on the first and second fin-type active patterns respectively, a first source/drain pattern formed between the first and second fin-type active patterns, gate insulator layers formed between the first and second gate electrodes and the first and second fin-type active patterns respectively, and gate spacers formed between the first and second gate electrodes and the first source/drain pattern, wherein the center portion of the top surface of the first source/drain pattern is higher than edge portions of the top surface of the first source/drain pattern, wherein a height of the first fin-type active pattern is between 50% and 90% of a height of the first source/drain pattern, wherein the height of the first source/drain pattern is a vertical distance between a lowest point of the lower surface of the first source/drain pattern and a highest point of the upper surface of the first source/drain pattern in a cross-sectional view, wherein the height of the first fin-type active pattern is a vertical distance between a lowest point of the lower surface of the first source/drain pattern and a highest point of an upper surface of the first source/drain pattern in a cross-sectional view.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
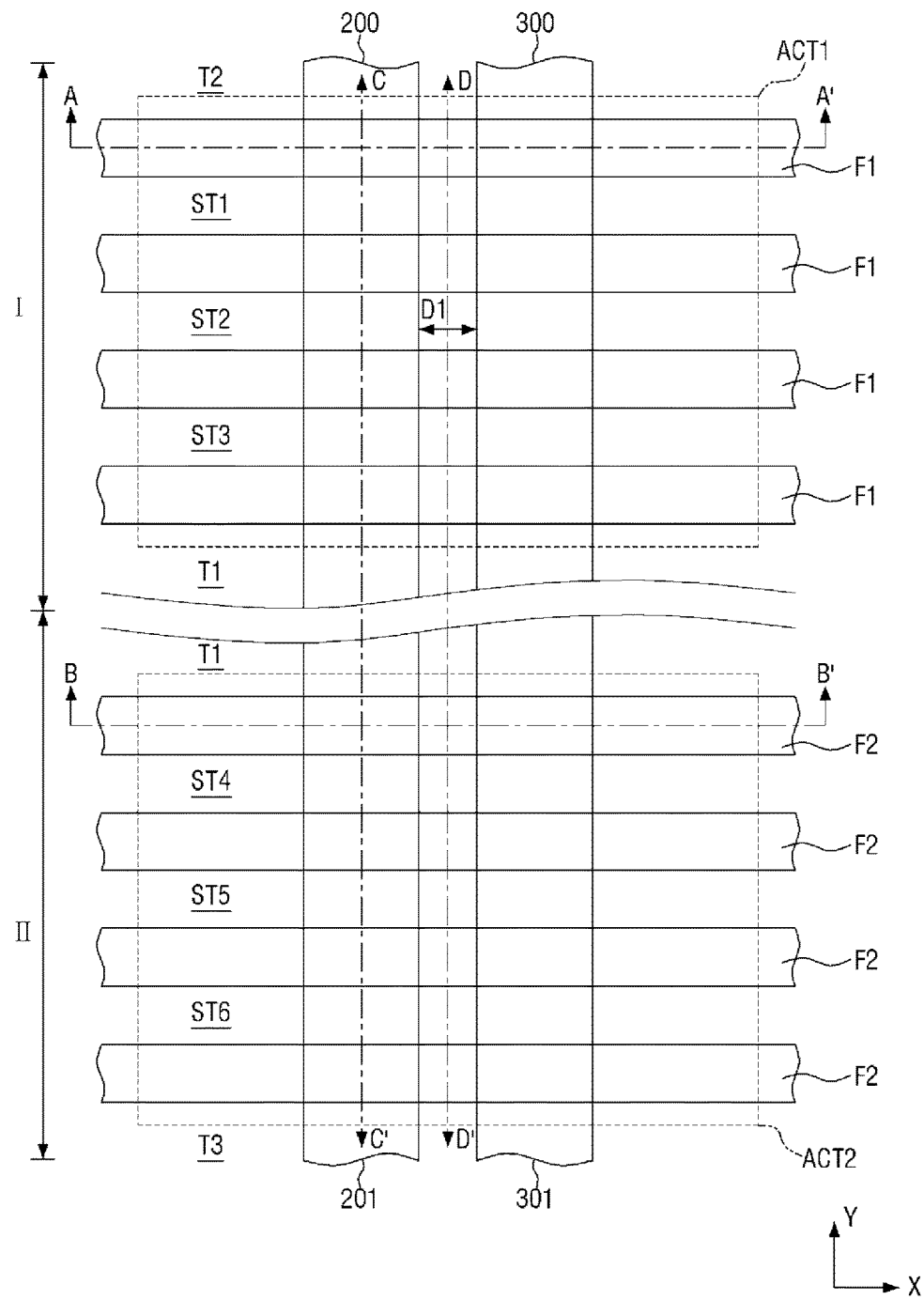
FIG. 1 is a layout diagram provided to explain a semiconductor device according to some exemplary embodiments.

Aspects of example embodiments of the present inventive concept will now be described more fully hereinafter with reference to the accompanying drawings. This invention may, however, be embodied in different forms and should not be construed as limited to the embodiments set forth herein. Rather, these example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. The same reference numbers indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinbelow, a semiconductor device according to some exemplary embodiments will be described with reference to FIGS. 1 to 10.

Figure 2:
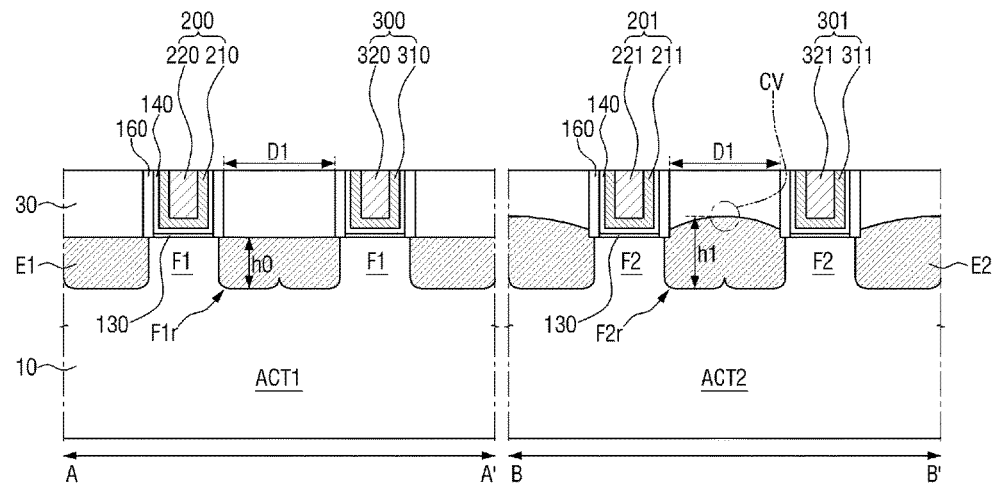
FIG. 2 are cross sectional views taken on lines A-A' and B-B' of FIG. 1.
Figure 3:
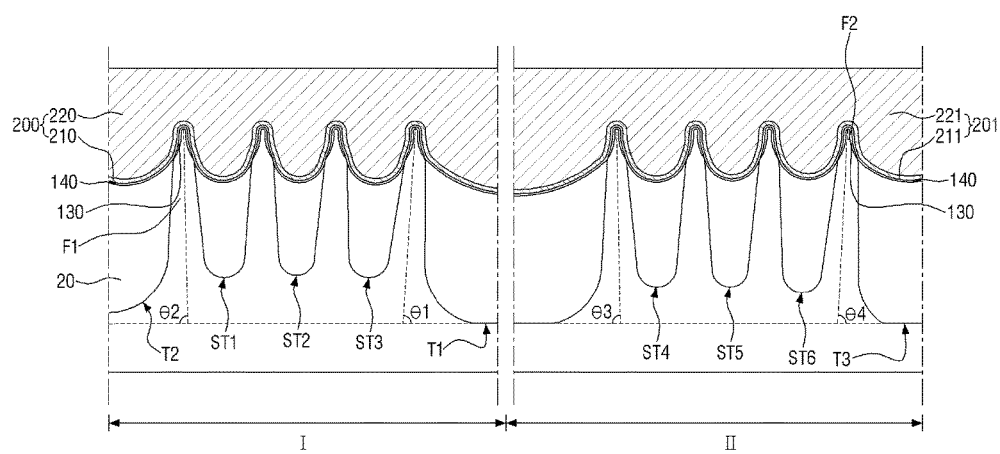
FIG. 3 is a cross sectional view taken on line C-C' of FIG. 1.
Figure 4:
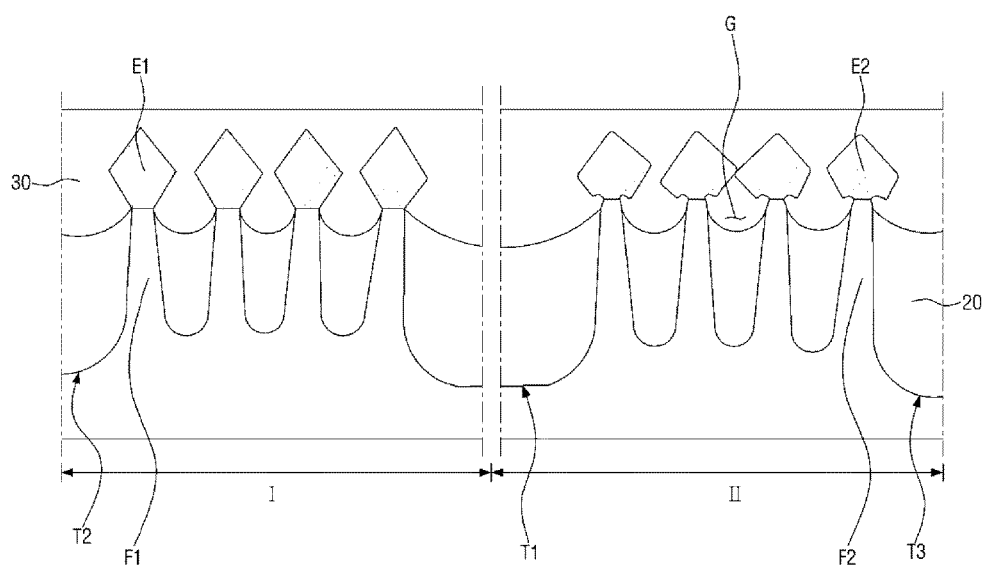
FIG. 4 is a cross sectional view taken on line D-D' of FIG. 1.
Figure 5:
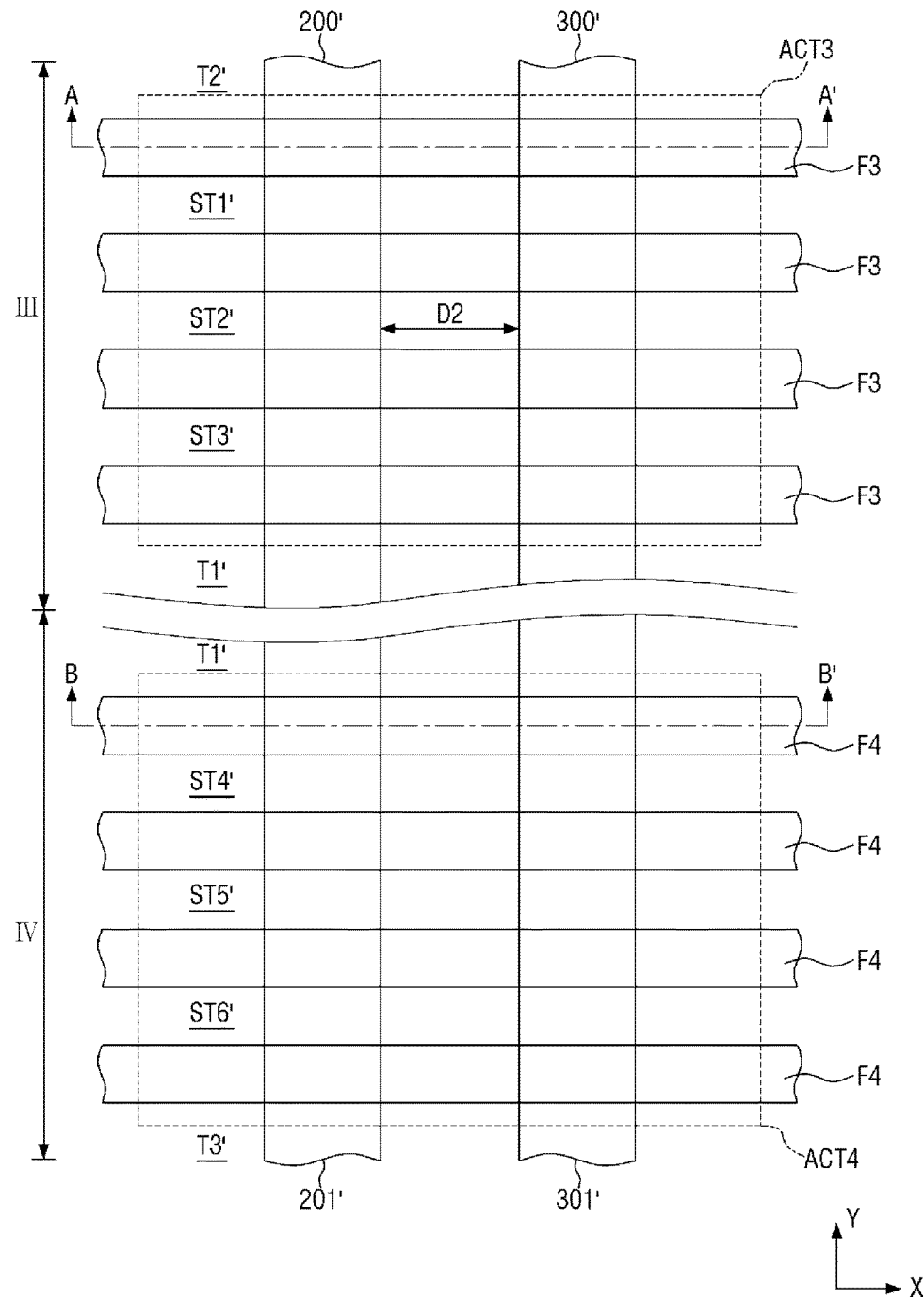
FIG. 5 is a layout diagram provided to explain a semiconductor device according to some exemplary embodiments.
Figure 6:
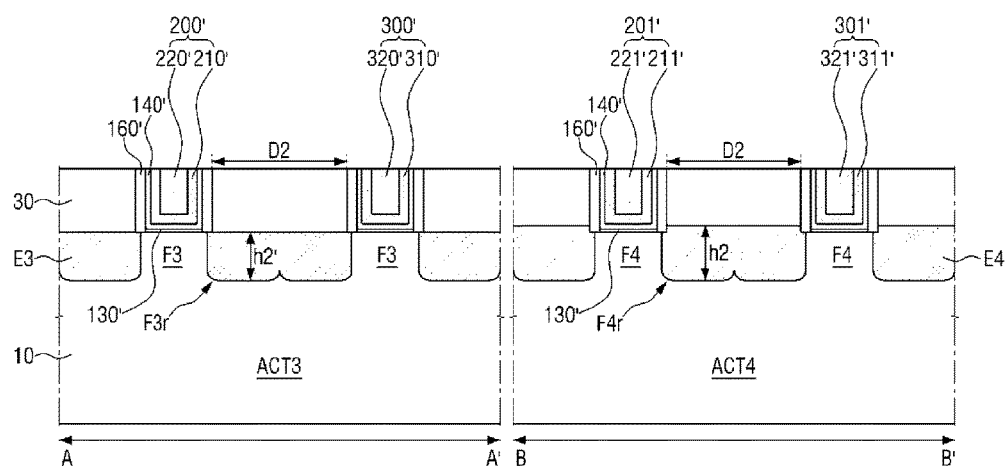
FIG. 6 are cross sectional views taken on lines A-A' and B-B' of FIG. 5.
Figure 7:
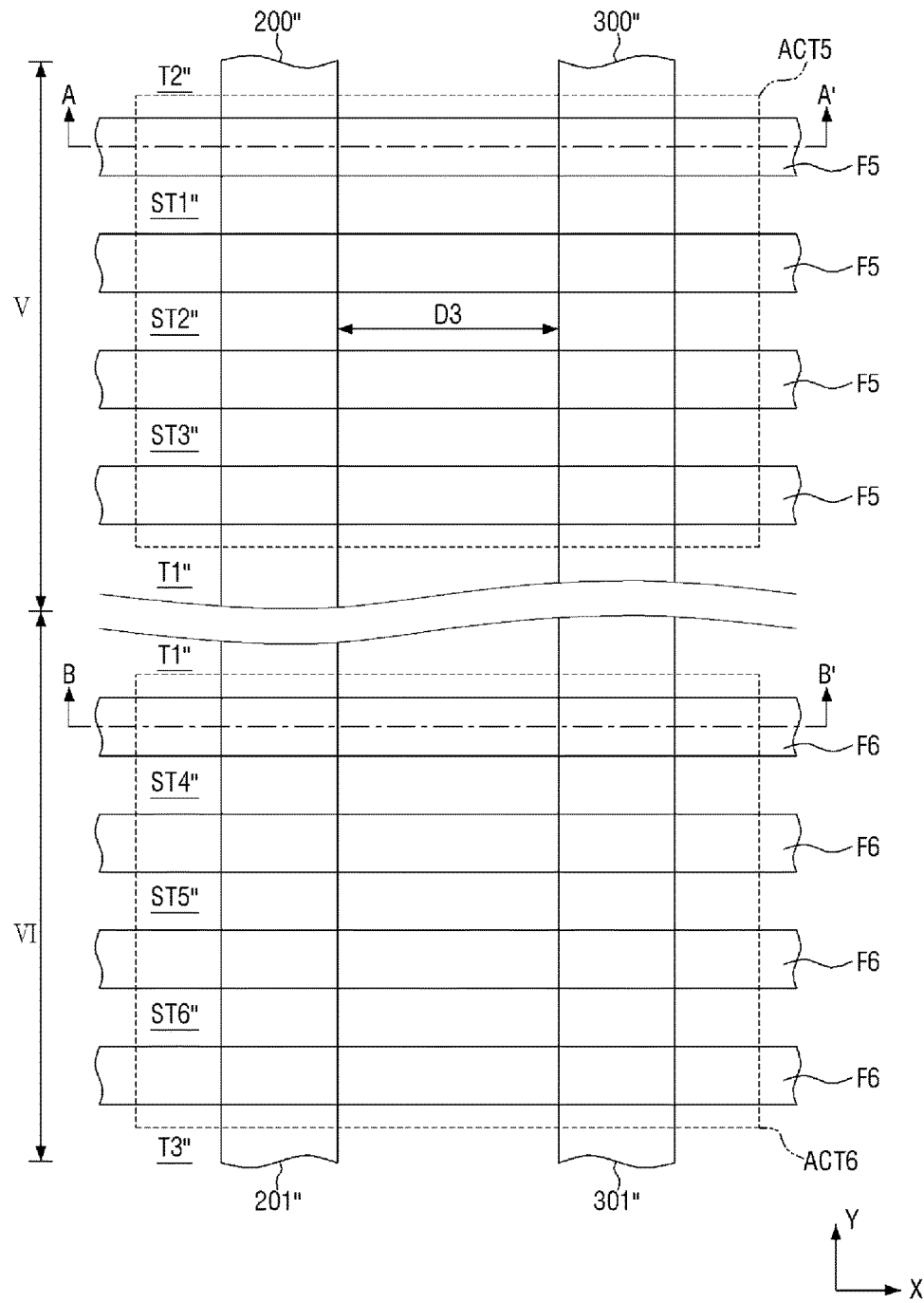
FIG. 7 is a layout diagram provided to explain a semiconductor device according to some exemplary embodiments.
Figure 8:
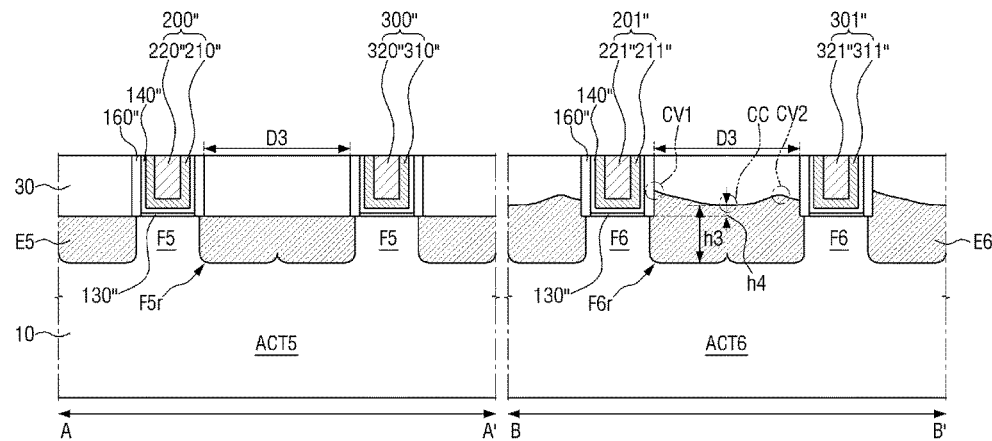
FIG. 8 are cross sectional views taken on lines A-A' and B-B' of FIG. 7.
Figure 9:
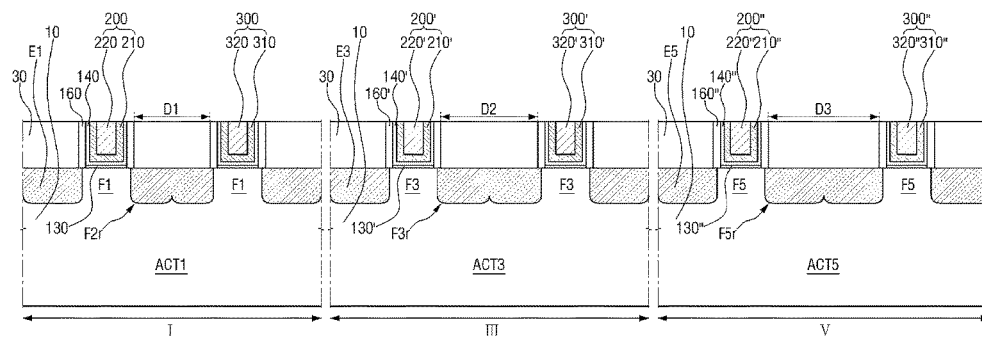
FIG. 9 are comparative cross sectional views provided to explain a semiconductor device according to some exemplary embodiments.
Figure 10:
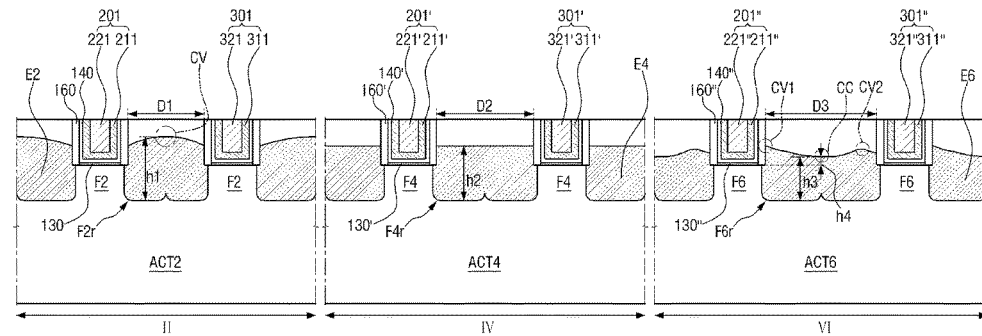
FIG. 10 are comparative cross sectional views provided to explain a semiconductor device according to some exemplary embodiments.

FIG. 1 is a layout diagram provided to explain a semiconductor device according to some exemplary embodiments, and FIG. 2 are cross sectional views taken on lines A-A' and B-B' of FIG. 1. FIG. 3 is a cross sectional view taken on line C-C' of FIG. 1, and FIG. 4 is a cross sectional view taken on line D-D' of FIG. 1. FIG. 5 is a layout diagram provided to explain a semiconductor device according to some exemplary embodiments, and FIG. 6 are cross sectional views taken on lines A-A' and B-B' of FIG. 5. FIG. 7 is a layout diagram provided to explain a semiconductor device according to some exemplary embodiments, and FIG. 8 are cross sectional views taken on lines A-A' and B-B' of FIG. 7. FIG. 9 are comparative cross sectional views provided to explain a semiconductor device according to some exemplary embodiments, and FIG. 10 are comparative cross sectional views provided to explain a semiconductor device according to some exemplary embodiments.

For convenience of explanation, FIGS. 1, 5, and 7 each are layouts of the first region I to the sixth region VI. Further, FIGS. 2 to 4, 6, and 8 each are cross sectional views of FIGS. 1, 5, and 7. In addition, for comparison to each regions, FIG. 9 shows comparative cross sectional views of the first region I, the third region III, and the fifth region V, and FIG. 10 shows comparative cross sectional views of the second region II, the fourth region IV, and the sixth region VI.

First, referring to FIGS. 1 to 4, a semiconductor device according to some exemplary embodiments may include a substrate 10, a first fin-type pattern F1, a second fin-type pattern F2, first to sixth shallow trenches ST1-ST6, first to third trenches T1-T3, a first interlayer insulating film 20, a second interlayer insulating film 30, a first gate electrode 200, a second gate electrode 300, a third gate electrode 201, a fourth gate electrode 301, gate insulating films 130 and 140, a gate spacer 160, a first source/drain E1, a second source/drain E2, and so on.

The substrate 10 may be, for example, a bulk silicon or a silicon-on-insulator (SOI). Alternatively, the substrate 10 may be a silicon substrate, or may include other material such as silicon germanium, indium antimonide, lead telluride compound, indium arsenide, indium phosphide, gallium arsenide, or gallium antimonide. Alternatively, the substrate 10 may be a base substrate having an epitaxial layer formed thereon.

The substrate 10 may include a first region I and a second region II. The first region I and the second region II may be the regions adjacent to each other, or spaced apart from each other. Accordingly, the first fin-type pattern F1 in the first region I and the second fin-type pattern F2 in the second region II may extend in different directions from each other. However, for convenience of explanation, it will be explained herein that the first fin-type pattern F1 in the first region I and the second fin-type pattern F2 in the second region II extend in the same directions as each other.

Different conductivity types of transistors may be formed in the first region I and the second region II. For example, the first region I may be a region where a PMOS is formed, and the second region II may be a region where an NMOS is formed, although exemplary embodiments are not limited thereto.

The first region I and the second region II may be defined by a first trench T1, a second trench T2, and a third trench T3. The first trench T1 may have first and second side surfaces opposite of each other. The first trench T1 may be in contact with the first region I at the first side surface, and may be in contact with the second region II at the second side surface.

The first region I may include a first active region ACT1, and the second region II may include a second active region ACT2. The first active region ACT1 and the second active region ACT2 may be adjacent to each other, or spaced apart from each other.

The second trench T2 may be in contact with the first region I. For example, the first region I may be located between the first trench T1 and the second trench T2. The third trench T3 may be in contact with the second region II. For example, the second region II may be located between the first trench T1 and the second trench T2.

Referring to FIG. 1, the first fin-type pattern F1 and the second fin-type pattern F2 may extend longitudinally in a first direction X. As illustrated in FIG. 1, the first fin-type pattern F1 and the second fin-type pattern F2 may have a rectangular shape, although exemplary embodiments are not limited thereto. If the first fin-type pattern F1 and the second fin-type pattern F2 are in the rectangular shape, the first fin-type pattern F1 and the second fin-type pattern F2 may include long sides extending in the first direction X and short sides extending in a second direction Y. In this case, the second direction Y may be the direction that is not parallel to, but intersects the first direction X.

The first fin-type pattern F1 may be plural, and the first fin-type patterns F1 may be spaced apart from one another in the second direction Y. The second fin-type pattern F2 may be plural, and the second fin-type patterns F2 may be spaced apart from one another in the second direction Y.

A plurality of first fin-type patterns F1 may be defined by the first to third shallow trenches ST1-ST3. Further, a plurality of second fin-type patterns F2 may be defined by the fourth to sixth shallow trenches ST4-ST6. For example, in the first region I, the first fin-type patterns F1 are defined by the first trench T1, the second trench T2, and the first to third shallow trenches ST1-ST3, and in the second region II, the second fin-type patterns F2 are defined by the first trench T1, the third trench T3, and the fourth to sixth shallow trenches ST4-ST6.

A depth of the first to sixth shallow trenches ST1-ST6 may be less than or equal to that of the first to third trenches T1-T3. However, a width of the first to sixth shallow trenches ST1-ST6 may be less than that of the first to third trenches T1-T3. Accordingly, a volume of the first interlayer insulating film 20 formed in the first to third trenches T1-T3 may be greater than that of the first interlayer insulating film 20 formed in the first to sixth shallow trenches ST1-ST6.

The first fin-type patterns F1 and the second fin-type patterns F2 may be formed by etching a portion of the substrate 10, and may include an epitaxial layer grown from the substrate 10. The first fin-type patterns F1 and the second fin-type patterns F2 may include an element semiconductor material such as silicon or germanium, for example. The first fin-type patterns F1 and the second fin-type patterns F2 may include a compound semiconductor such as, for example, IV-IV group compound semiconductor or III-V group compound semiconductor.

For example, in case the first and second fin-type patterns F1 and F2 are a IV-IV group compound semiconductor, the first fin-type patterns F1 and the second fin-type patterns F2 may be a binary compound or a ternary compound including at least two or more of carbon (C), silicon (Si), germanium (Ge) or tin (Sn), or these compounds doped with IV group element.

In case the first and second fin-type patterns F1 and F2 are a III-V group compound semiconductor for instance, the first fin-type patterns F1 and the second fin-type patterns F2 may be one of a binary compound, a ternary compound or a quaternary compound which is formed by a combination of a group III element and a group V element. The group III element may be at least one of aluminum (Al), gallium (Ga), and indium (In), and the group V element may be one of phosphorus (P), arsenic (As) and antimony (Sb).

In the semiconductor devices according to exemplary embodiments, the first fin-type patterns F1 and the second fin-type patterns F2 may include silicon.

The first interlayer insulating film 20 may partially fill the first to sixth shallow trenches ST1-ST6 and the first to third trenches T1-T3. The first interlayer insulating film 20 may partially surround side surfaces of the first and second fin-type patterns F1 and F2.

For example, the first interlayer insulating film 20 may include at least one of silicon oxide, silicon nitride, silicon oxynitride, and a low-k dielectric material with a smaller dielectric constant than silicon oxide. For example, the low-k dielectric material may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof, but not limited thereto.

The first interlayer insulating film 20 may have a specific stress characteristic. For example, the first interlayer insulating film 20 may have a tensile stress characteristic as its volume is shrunken by a heat treatment after deposition. A slope of the first and second fin-type patterns F1 and F2 may be determined by the tensile stress characteristic of the first interlayer insulating film 20, according to a volume of the first interlayer insulating film 20. For example, when the volumes of the first interlayer insulating film 20 on both side surfaces are different from each other, the fin-type patterns may incline. For example, the fin-type patterns may incline more as the difference of the volumes of the first interlayer insulating film 20 increases between both sides of the fin-type patterns. For example, in a mathematical terms, the slope of a fin-type pattern may decrease as the difference of the volumes of the first interlayer insulation film increase between both sides of the fin-type pattern with respective to a horizontal direction corresponding to an extending direction of the substrate 10 (e.g. XY plane of FIG. 1). This is because the shrink rate of the first interlayer insulating film 20 of larger volume is larger than the shrink rate of the first interlayer insulating film 20 of smaller volume. For example, the first interlayer insulating film 20 of a larger volume shrinks more than the first interlayer insulating film 20 of smaller volume.

For example, the first fin-type patterns F1 being in direct contact with the first trench T1 and the second trench T2 may be inclined toward the first trench T1 and the second trench T2, respectively.

For example, the angles of the first fin-type patterns F1 being in direct contact with the first trench T1 and the second trench T2 are respectively a first angle θ1 and a second angle θ2 toward the respective first and second trenches T1 and T2 with respect to a vertical direction which is perpendicular to the XY plane of FIG. 1.

The second fin-type patterns F2 being in direct contact with the first trench T1 and the third trench T3 may be inclined toward the first trench T1 and the third trench T3, respectively.

For example, the angles of the second fin-type patterns F2 being in direct contact with the respective first and third trenches T1 and T3 are respectively a third angle θ3 and a fourth angle θ4 with respect to the vertical direction.

The first to fourth angles θ1-θ4 may be acute angles. For example, the first fin-type patterns F1 and the second fin-type patterns F2 may be inclined by an acute angle toward the larger trenches.

The first gate electrode 200 and the second gate electrode 300 may extend parallel to each other. The first gate electrode 200 and the second gate electrode 300 may extend in the second direction Y. The first gate electrode 200 and the second gate electrode 300 may be spaced apart from each other in the first direction X. The first gate electrode 200 may be spaced apart from the second gate electrode 300 by a first distance D1.

The third gate electrode 201 and the fourth gate electrode 301 may extend parallel to each other. The third gate electrode 201 and the fourth gate electrode 301 may extend in the second direction Y. The third gate electrode 201 and the fourth gate electrode 301 may be spaced apart from each other in the first direction X. The third gate electrode 201 may be spaced apart from the fourth gate electrode 301 by the first distance D1. For example, the spacing distances between two gate electrodes may be identical in the first region I and the second region II.

The first gate electrode 200 and the third gate electrode 201 may extend in the second direction Y. The first gate electrode 200 may intersect the respective first fin-type patterns F1. For example, the first gate electrode 200 may include portions overlapping with the plurality of spaced-apart first fin-type patterns F1. The first fin-type patterns F1 may respectively include a portion overlapping and another portion non-overlapping with the first gate electrode 200.

The third gate electrode 201 may intersect the respective second fin-type patterns F2. For example, the third gate electrode 201 may include portions overlapping with the plurality of spaced-apart second fin-type patterns F2. The second fin-type patterns F2 may respectively include a portion overlapping and another portion non-overlapping with the third gate electrode 201.

The second gate electrode 300 and the fourth gate electrode 301 may extend in the second direction Y. The second gate electrode 300 may intersect the respective first fin-type patterns F1. For example, the second gate electrode 300 may include portions overlapping with the plurality of spaced-apart first fin-type patterns F1. The first fin-type patterns F1 may respectively include a portion overlapping and another portion non-overlapping with the second gate electrode 300.

The fourth gate electrode 301 may intersect the respective second fin-type patterns F2. For example, the fourth gate electrode 301 may include portions overlapping with the plurality of spaced-apart second fin-type patterns F2. The second fin-type patterns F2 may respectively include a portion overlapping and another portion non-overlapping with the fourth gate electrode 301.

The first gate electrode 200 and the third gate electrode 201 may or may not be connected with each other. Likewise, the second gate electrode 300 and the fourth gate electrode 301 may or may not be connected with each other.

Referring to FIGS. 2 and 3, the first gate electrode 200 may include a first work function metal 210 and a first filling metal 220. The first work function metal 210 plays a role of adjusting a work function, and the first filling metal 220 plays a role of filling the space formed by the first work function metal 210. The first work function metal 210 may be, for example, an N-type work function metal, a P-type work function metal, or a combination thereof.

The second gate electrode 300 may include a second work function metal 310 and a second filling metal 320. The second work function metal 310 plays a role of adjusting a work function, and the second filling metal 320 plays a role of filling the space formed by the second work function metal 310. The second work function metal 310 may be, for example, an N-type work function metal, a P-type work function metal, or a combination thereof.

In some exemplary embodiments, the first region I may be a PMOS region, and therefore the first work function metal 210 and the second work function metal 310 may be a combination of an N-type work function metal and a P-type work function metal. For example, the first work function metal 210 and the second work function metal 310 may include at least one of TiN, WN, TiAl, TiAlN, TaN, TiC, TaC, TaCN, TaSiN, or a combination thereof, but not limited thereto. The first filling metal 220 and the second filling metal 320 may include, for example, at least one of W, Al, Cu, Co, Ti, Ta, poly-Si, SiGe, or a metal alloy, but not limited thereto.

The third gate electrode 201 may include a third work function metal 211 and a third filling metal 221. The third work function metal 211 plays a role of adjusting a work function, and the third filling metal 221 plays a role of filling the space formed by the third work function metal 211. The third work function metal 211 may be, for example, an N-type work function metal, a P-type work function metal, or a combination thereof.

The fourth gate electrode 301 may include a fourth work function metal 311 and a fourth filling metal 321. The fourth work function metal 311 plays a role of adjusting a work function, and the fourth filling metal 321 plays a role of filling the space formed by the fourth work function metal 311. The fourth work function metal 311 may be, for example, an N-type work function metal, a P-type work function metal, or a combination thereof.

In some exemplary embodiments, the second region II may be an NMOS region, and therefore the third work function metal 211 and the fourth work function metal 311 may be an N-type work function metal. The third work function metal 211 and the fourth work function metal 311 may include, for example, at least one of TiN, WN, TiAl, TiAlN, TaN, TiC, TaC, TaCN, TaSiN, or a combination thereof, but not limited thereto. The third filling metal 221 and the fourth filling metal 321 may include, for example, at least one of W, Al, Cu, Co, Ti, Ta, poly-Si, SiGe, or a metal alloy, but not limited thereto.

For example, the first gate electrode 200, the second gate electrode 300, the third gate electrode 201, and the fourth gate electrode 301 may be formed by a replacement process or a gate last process, but not limited thereto.

The gate insulating films 130 and 140 may be formed between the first and second fin-type patterns F1 and F2 and the first and third gate electrodes 200 and 201 respectively, and between the first interlayer insulating film 20 and the respective first and third gate electrodes 200 and 201.

The gate insulating films 130 and 140 may be formed between the first and second fin-type patterns F1 and F2 and the second and fourth gate electrodes 300 and 301 respectively, and between the first interlayer insulating film 20 and the respective second and fourth gate electrodes 300 and 301.

The gate insulating films 130 and 140 may include an interfacial film 130 and a high-k dielectric film 140.

The interfacial film 130 may be formed by oxidizing portions of the first fin-type patterns F1 and the second fin-type patterns F2. The interfacial film 130 may be formed along a profile of the first fin-type patterns F1 and the second fin-type patterns F2 protruding upward from an upper surface of the first interlayer insulating film 20. For example, the interfacial film 130 may be formed conformally on the first and second fin-type patterns F1 and F2. When the first fin-type patterns F1 and the second fin-type patterns F2 are silicon fin-type patterns including silicon, the interfacial film 130 may include a silicon oxide film.

As illustrated in FIG. 3, the interfacial film 130 may not be formed along the upper surface of the first interlayer insulating film 20, but exemplary embodiments are not limited thereto. Depending on methods of forming the interfacial film 130, the interfacial film 130 may be formed along the upper surface of the first interlayer insulating film 20.

Alternatively, even when the first interlayer insulating film 20 includes silicon oxide, when the silicon oxide included in the first interlayer insulating film 20 has different properties from the silicon oxide film included in the interfacial film 130, the interfacial film 130 may be formed along the upper surface of the first interlayer insulating film 20.

The high-k dielectric film 140 may be formed between the interfacial film 130 and the respective first, second, third and fourth gate electrodes 200, 300, 201 and 301. It may be formed along the profile of the first fin-type patterns F1 and the second fin-type patterns F2 protruding upward from the upper surface of the first interlayer insulating film 20. For example, the high-k dielectric film 140 may be conformally formed on the first and second fin-type patterns F1 and F2 and gate spacers 160. Further, the high-k dielectric film 140 may be formed between the respective first and second gate electrodes 200 and 300 and the first interlayer insulating film 20, and between the respective third and fourth gate electrodes 201 and 301 and the first interlayer insulating film 20.

The high-k dielectric film 140 may include a high-k dielectric material having a higher dielectric constant than silicon oxide film. For example, the high-k dielectric film 140 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but not limited thereto.

A gate spacer 160 may be disposed on a sidewall of the first to fourth gate electrodes 200, 201, 300 and 301 extending in the second direction Y. The gate spacer 160 may include, for example, at least one of silicon nitride (SiN), silicon oxynitride (SiON), silicon oxide ($SiO_2$), silicon oxycarbonitride (SiOCN), and a combination thereof.

As illustrated in the drawings, the gate spacer 160 may be a single film as an example, but it may be multiple spacers in which a plurality of films are stacked. A shape of the gate spacer 160 and respective shapes of the multiple spacers forming the gate spacer 160 may be I- or L-shape, or a combination thereof depending on the fabrication process and use.

Referring to FIGS. 2 and 4, the first source/drain E1 may be formed on either side of the first gate electrode 200 and second gate electrode 300 in the first direction X, and on the respective first fin-type patterns F1. The first source/drain E1 may be source/drain regions of respective transistors on the first fin-type patterns F1.

The second source/drain E2 may be formed on either side of the third gate electrode 201 and fourth gate electrode 301 in the first direction X, and on the respective second fin-type patterns F2. The second source/drain E2 may be source/drain regions of respective transistors on the second fin-type patterns F2.

The first source/drain E1 and the second source/drain E2 may include an epitaxial layer formed by epitaxy. For example, the first source/drain E1 and/or the second source/drain E2 may be a raised source/drain. The first region I may be a PMOS region and the second region II may be an NMOS region. For example, the first source/drain E1 may be a SiGe epitaxial layer. The second source/drain E2 may be a Si epitaxial layer, for example. At this time, the second source/drain E2 may include Si:P highly doped with phosphorus P.

The first source/drain E1 may fill a recess F1r of the first fin-type patterns F1. Likewise, the second source/drain E2 may fill a recess F2r of the second fin-type patterns F2. Accordingly, the first source/drain E1 and the second source/drain E2 may have a lower portion in a U-shape along a bottom surface of the recesses F1r and F2r. In some exemplary embodiments, the first source/drain E1 and the second source/drain E2 may have a lower portion of W-shape or UU-shape having a series of U-shapes according to a formation of the recesses F1r and F2r.

FIG. 2 are cross sectional views in the first direction X, and FIG. 4 are cross sectional views in the second direction Y.

Referring first to FIG. 2, the first source/drain E1 in the first region I may be formed so as to fill a recess F1r formed on an upper surface of the first fin-type patterns F1. At this time, since a first gate electrode 200 and a second gate electrode 300 are formed in the portion in which no recess F1r is formed on the upper surface of the first fin-type patterns F1, the first source/drain E1 may be formed between the first gate electrode 200 and the second gate electrode 300.

The first source/drain E1 may have a same level of upper surface as the first fin-type patterns F1. For example, a height of an upper surface of the first source/drain E1 may be equal to a height of the upper surface of the first fin-type patterns F1. For example, the upper surface of the first source/drain E1 and the upper surface of an adjacent first fin-type pattern F1 may be in the same level with respect to an extending surface of the substrate 10. For example, the height of the first source/drain E1 may be a vertical distance from the lowest point of the first source/drain E1 to the highest point of the source/drain E1. Other heights of source/drains may be defined similarly. The height of the first source/drain E1 may be between 25 nm and 45 nm. The height of the first source/drain E1 may be between 30 nm and 40 nm. The upper surface of the first source/drain E1 may be flat. For example, a height of a highest point of the upper surface from a lowermost level of the upper surface may be less than 5 nm. A height discussed in this disclosure may be a vertical distance between two points, and the vertical distance is taken in a perpendicular direction to an extending surface of the substrate 10. A portion of the upper surface of the first source/drain E1 may be overlapped with a portion of a lower surface of the gate spacer 160. For example, a portion of the upper surface of the first source/drain E1 may be contact with a portion of a lower surface of the gate spacer 160.

The second source/drain E2 in the second region II may be formed so as to fill a recess F2r formed on an upper surface of the second fin-type patterns F2. At this time, since a third gate electrode 201 and a fourth gate electrode 301 are formed in the portion in which no recess F2r is formed on the upper surface of the second fin-type patterns F2, the second source/drain E2 may be formed between the third gate electrode 201 and the fourth gate electrode 301.

The second source/drain E2 may have a higher upper surface than those of the second fin-type patterns F2. For example, a height of an upper surface of the second source/drain E2 may be greater than that of the upper surface of the second fin-type patterns F2. The upper surface of the second source/drain E2 may have a convex portion CV. A portion of the upper surface of the second source/drain E2 may be overlapped with a portion of the lower surface of the gate spacer 160. For example, a portion of the upper surface of the second source/drain E2 may be in contact with a portion of the lower surface of the gate spacer 160. For example, the height of the second source/drain E2 may be between 30 nm and 60 nm. The height of the second source/drain E2 may be between 40 nm and 50 nm.

The convex portion CV of the upper surface of the second source/drain E2 may be formed convexly from the bottom surface of the recess F2r formed in the second fin-type pattern F2 by a first height h1. The first height h1 may be greater than a height h0 at which the upper surface of the first source/drain E1 is spaced apart from the bottom surface of the recess F1r. For example, the first height h1 may be between 30 nm and 60 nm. The first height h1 may be between 40 nm and 50 nm. For example, the ratio of h1 to h0 may be between 1.1:1 and 2:1. For example the ratio of h1 to h0 may be between 1.2:1 and 1.5:1.

Referring to FIG. 4, an outer circumference of the first source/drain E1 and the second source/drain E2 may have a variety of shapes. For example, the outer circumference of the first source/drain E1 and the second source/drain E2 may have at least one among diamond, circle, or rectangle shapes. FIG. 4 illustrates a diamond shape (or pentagon or hexagon shape) for example. Unless context indicates otherwise, shapes described herein refer to a two dimensional shape of a particular cross section or view (e.g., top view) of an element (e.g., fin, spacer, source/drain, etc.).

Since the semiconductor device according to an exemplary embodiment is a PMOS transistor in the first region I, the first source/drain E1 may include a compressive stress material. For example, the compressive stress material may be a material such as SiGe that has a higher lattice constant than Si. For example, the compressive stress material can enhance mobility of the carrier in the channel region by exerting compressive stress on the first fin-type pattern F1 (e.g. the channel region of the PMOS transistor).

When the semiconductor device according to an exemplary embodiment is an NMOS transistor in the second region II, the second source/drain E2 may include a tensile stress material. For example, when the second fin-type pattern F2 is silicon, the second source/drain E2 may be a material (e.g., SiC) having a smaller lattice constant than the silicon. For example, the tensile stress material can enhance mobility of the carrier in the channel region by exerting tensile stress on the second fin-type pattern F2 (e.g. the channel region of the NMOS transistor).

Referring to FIG. 4, each of the first source/drain E1 and the second source/drain E2 in the first and second regions I and II may be in a convex polygonal shape. As illustrated in FIG. 4, the convex polygonal shape may be pentagonal.

Cross sections of the first source/drains E1 may have convex polygonal shapes. In this case, cross sections of a plurality of first source/drains E1 may have the same shape as one another. The expression "the same" as used herein may include not only the completely same shape and size as one another, but also the concept that includes differently sized convex polygonal shapes having identical internal angles to each other.

For example, the first source/drains E1 may each be in bilateral symmetry. Each of the first source/drains E1 may include a lower region and an upper region formed on the lower region, and the lower region may have an increasing width as its height increases, and the upper region may have a decreasing width as its height increases.

Each of the upper regions may include a first outer surface and a second outer surface in symmetry with each other. Normal directions of the first outer surfaces may be the same as one another in the first source/drains E1. Normal directions of the second outer surfaces may be the same as one another in the first source/drains E1.

A plurality of first source/drains E1 may have the same internal angles as one another. In some exemplary embodiments, the internal angles may indicate only the three internal angles of each first source/drain E1 that are not in contact with the first fin-type patterns F1. For example, the three internal angles of a first source/drain E1 may have a constant value according to the crystal orientation.

Since the first region I may be a PMOS region, the first source/drains E1 may include SiGe, and its epitaxial growth may be carried out in a straight crystal orientation. Accordingly, cross sections of the first source/drains E1 may have the same shape as one another.

Referring to FIG. 4, each of the second source/drains E2 in the second region II may be in a convex polygonal shape. As illustrated in FIG. 4, the convex polygonal shape may be pentagonal. As used herein, the "convex polygonal shape" does not refer to only a figure having always flat surfaces, as it includes curved surfaces connecting internal angles. The internal angles may have a shape having distinct characteristics. For example, the "convex polygonal shape" may include a convex polygonal shape distorted by a manufacturing process. For example, as illustrated in FIG. 4, while "convex polygonal shape" as used herein may be characterized as having the example internal angles as shown below, it may also have other internal angles than the example internal angles, and a surface connecting each of the internal angles may not be a plane.

The second source/drains E2 may be in different shapes from each other. For example, the second source/drains E2 may have different internal angles from each other.

Because the second region II may be an NMOS region, the second source/drain E2 may include Si or Si:P, and its epitaxial growth may be carried out in a non-straight crystal orientation, unlike the first region I. Accordingly, a plurality of second source/drains E2 may have different shapes from each other.

Each of the second source/drains E2 may include a lower region and an upper region formed on the lower region, and the lower region may have an increasing width as its height increases, and the upper region may have a decreasing width as its height increases.

In the second source/drains E2, each of the upper regions may include a third outer surface and a fourth outer surface in symmetry with each other, and the normal directions of the third outer surfaces may be different from one another in the second source/drains E2. Normal directions of the fourth outer surfaces may be different from one another in the second source/drains E2.

A height of an interface in which the first source/drains E1 and the first fin-type patterns F1 meet in the first region I may be less than that of an interface in which the second source/drains E2 and the second fin-type patterns F2 meet in the second region II. For example, the upper surfaces of the first source/drains E1 may be lower than the upper surfaces of the second source/drains E2.

For example, a recessed depth of the first fin-type pattern F1 in the first region I is deeper than a recessed depth of the second-fin-type pattern F2 in the second region. In the first region I, total volumes of the first source/drains E1 may be determined according to the degree of the recess F1r of the first fin-type pattern F1 because the shape of the first source/drain E1 is formed regularly. For example, the fin-type patterns may become narrower as the distance increases from the substrate 10. For example, the width of the upper surface of the recessed fin-type pattern may become greater with increasing depth of the recess F1r. For example, the total volume of each of the first source/drains E1 may be determined according to the width of the upper surface of the exposed fin-type pattern since the first source/drain E1 may be formed along the crystal orientation. For example, the width of the upper surface of the first source/drain E1 in a cross-sectional view as shown in FIG. 2 may be between 20 nm and 50 nm. For example the width of the upper surface of the first source/drain E1 in the cross-sectional view may be between 30 nm and 40 nm. For example, the width of the upper surface of the first source/drain E1 may be a distance between both end points of the upper surface in a cross-sectional view as shown in FIG. 2.

In contrast, because a shape of the second source/drain E2 is irregular in the second region II, the width of the upper surface of the exposed fin-type pattern may not influence a volume of the second source/drain E2. For example, how long the second source/drain E2 has been grown may determine the volume of the second source/drain E2. Therefore, unlike in the first region I, it may be beneficial to form a recess of the fin-type pattern shallow in the second region II. For example, a volume of a second source/drain E2 may depend on the time that the second source/drain E2 has been grown. Accordingly, the height of the interface of the fin-type pattern and the epitaxial pattern in the first region I may be lower than that of interface of the fin-type pattern and the epitaxial pattern in the second region II.

The upper surfaces of the second fin-type patterns F2 in the second region II may be higher than the upper surfaces of the first fin-type patterns F1 in the first region I. As such, the width of the upper surfaces of the second fin-type patterns F2 in the second region II may be less than that of the upper surfaces of the first fin-type patterns F1 in the first region I. For example, the width of the upper surface of the second source/drain E2 in a cross-sectional view as shown in FIG. 2 may be between 15 nm and 45 nm. For example the width of the upper surface of the first source/drain E1 in the cross-sectional view may be between 27 nm and 37 nm.

Some of the second source/drains E2 in the second region II may be in contact with each other. For example, some of the second source/drains E2 may be merged with neighboring second source/drains E2.

The first source/drains E1 in the first region I may not be in contact with each other, but spaced apart from each other, respectively. In contrast, at least one of the second source/drains E2 may be in contact with each other. This is because a width of the second source/drain E2 in the second region II may be grown greater than that of the first source/drains E1 in the first region I.

In a semiconductor device according to some exemplary embodiments, as portions of the second source/drains E2 are in contact with each other in the second region II, an air gap G may be formed under the merged second source/drains E2.

The air gap G may be formed between two second source/drains E2 being in contact with each other. The air gap G may be formed on the first interlayer insulating film 20. The air gap G may be covered by two second source/drains E2 being in contact with each other.

Then, another region of the semiconductor device according to some exemplary embodiments will be described with reference to FIGS. 5 and 6. Regions in FIGS. 5 to 6 may include a third fin-type pattern F3, a fourth fin-type pattern F4, first to sixth shallow trenches ST1'-ST6', first to third trenches T1'-T3', a first interlayer insulating film 20, a second interlayer insulating film 30, a fifth gate electrode 200', a sixth gate electrode 300', a seventh gate electrode 201', an eighth gate electrode 301', gate insulating films 130' and 140', a gate spacer 160', a third source/drain E3, a fourth source/drain E4, and so on.

The third region III and the fourth region IV may have similar structures with the first region I and the second region II described above. However, a distance between the fifth gate electrode 200' and the sixth gate electrode 300' in the third region III, and a distance between the seventh gate electrode 201' and the eighth gate electrode 301' in the fourth region IV may be a second distance D2 that is greater than the first distance D1 in the first region I and the second region II.

The fifth gate electrode 200' may include a fifth work function metal 210' and a fifth filling metal 220'. The fifth work function metal 210' plays a role of adjusting a work function, and the fifth filling metal 220' plays a role of filling the space formed by the fifth work function metal 210'. The fifth work function metal 210' may be, for example, an N-type work function metal, a P-type work function metal, or a combination thereof.

The sixth gate electrode 300' may include a sixth work function metal 310' and a sixth filling metal 320'. The sixth work function metal 310' plays a role of adjusting a work function, and the sixth filling metal 320' plays a role of filling the space formed by the sixth work function metal 310'. The sixth work function metal 310' may be, for example, an N-type work function metal, a P-type work function metal, or a combination thereof.

In some exemplary embodiments, the third region III may be a PMOS region, and therefore the fifth work function metal 210' and the sixth work function metal 310' may be a combination of an N-type work function metal and a P-type work function metal. For example, the fifth work function metal 210' and the sixth work function metal 310' may include at least one of TiN, WN, TiAl, TiAlN, TaN, TiC, TaC, TaCN, TaSiN, or a combination thereof, but not limited thereto. The fifth filling metal 220' and the sixth filling metal 320' may include, for example, at least one of W, Al, Cu, Co, Ti, Ta, poly-Si, SiGe, or a metal alloy, but not limited thereto.

The seventh gate electrode 201' may include a seventh work function metal 211' and a seventh filling metal 221'. The seventh work function metal 211' plays a role of adjusting a work function, and the seventh filling metal 221' plays a role of filling the space formed by the seventh work function metal 211'. The seventh work function metal 211' may be, for example, an N-type work function metal, a P-type work function metal, or a combination thereof.

The eighth gate electrode 301' may include an eighth work function metal 311' and an eighth filling metal 321'. The eighth work function metal 311' plays a role of adjusting a work function, and the eighth filling metal 321' plays a role of filling the space formed by the eighth work function metal 311'. The eighth work function metal 311' may be, for example, an N-type work function metal, a P-type work function metal, or a combination thereof.

In some exemplary embodiments, the fourth region IV may be an NMOS region, and therefore the seventh work function metal 211' and the eighth work function metal 311' may be an N-type work function metal. The seventh work function metal 211' and the eighth work function metal may include, for example, at least one of TiN, WN, TiAl, TiAlN, TaN, TiC, TaC, TaCN, TaSiN, or a combination thereof, but not limited thereto. The seventh filling metal 221' and the eighth filling metal 321' may include at least one of, for example, W, Al, Cu, Co, Ti, Ta, poly-Si, SiGe, or a metal alloy, but not limited thereto.

For example, the fifth gate electrode 200', the sixth gate electrode 300', the seventh gate electrode 301', and the eighth gate electrode 301' may be formed by a replacement process or a gate last process, but not limited thereto.

Third source/drains E3 may be formed on both sides of the fifth gate electrode 200' and the sixth gate electrode 300' in the first direction X, and on the respective third fin-type patterns F3. The third source/drains E3 may be source/drain regions of respective transistors on the third fin-type patterns F3.

Fourth source/drains E4 may be formed on both sides of the seventh gate electrode 201' and the eighth gate electrode 301' in the first direction X, and on the respective fourth fin-type patterns F4. The fourth source/drains E4 may be source/drain regions of respective transistors on the fourth fin-type patterns F4.

The third source/drains E3 and the fourth source/drains E4 may include an epitaxial layer formed by epitaxy. For example, the third source/drains E3 and the fourth source/drains E4 may be raised source/drains. The third region III may be a PMOS region and the fourth region IV may be an NMOS region, and therefore the third source/drains E3 may be SiGe epitaxial layers, for example. The fourth source/drains E4 may be Si epitaxial layers, for example. At this time, the fourth source/drains E4 may include Si:P highly doped with phosphorus P.

The third source/drains E3 may fill a recess F3r of the third fin-type patterns F3. Likewise, the fourth source/drains E4 may fill a recess F4r of the fourth fin-type patterns F4.

FIG. 6 is a cross sectional view in a first direction X. Referring to FIG. 6, the third source/drains E3 in the third region III may be formed so as to fill the recess F3r formed on an upper surface of the third fin-type patterns F3. At this time, since the fifth gate electrode 200' and the sixth gate electrode 300' are formed in a portion in which no recess F3r is formed on the upper surface of the third fin-type patterns F3, the third source/drains E3 may be formed between the fifth gate electrode 200' and the sixth gate electrode 300'.

The third source/drains E3 may have a same level of upper surface as the third fin-type patterns F3. For example, a height of an upper surface of the third source/drains E3 may be equal to a height of the upper surface of the third fin-type patterns F3. The upper surface of the third source/drains E3 may be flat. For example, a height of a highest point of the upper surface from a lowermost level of the upper surface may be less than 5 nm. A portion of the upper surface of the third source/drains E3 may be overlapped with a portion of the lower surface of the gate spacer 160'. For example, a portion of the upper surface of the third source/drains E3 may be in contact with a portion of a lower surface of the gate spacer 160'.

The fourth source/drains E4 in the fourth region IV may be formed so as to fill the recess F4r formed on an upper surface of the fourth fin-type patterns F4. At this time, since the seventh gate electrode 201' and the eighth gate electrode 301' are formed in the portion in which no recess F4r is formed on the upper surface of the fourth fin-type patterns F4, the fourth source/drains E4 may be formed between the seventh gate electrode 201' and the eighth gate electrode 301'.

The fourth source/drains E4 may have a same level of upper surface as the fourth fin-type patterns F4. For example, a height of an upper surface of the fourth source/drains E4 may be equal to a height of the upper surface of the fourth fin-type patterns F4. The upper surface of the fourth source/drains E4 may be flat. For example, a height of a highest point of the upper surface from a lowermost level of the upper surface may be less than 5 nm. A portion of the upper surface of the fourth source/drains E4 may be overlapped with a portion of the lower surface of the gate spacer 160'. For example, a portion of the upper surface of the fourth source/drains E4 may be in contact with a portion of a lower surface of the gate spacer 160'.

The upper surface of the fourth source/drains E4 may be formed apart from the bottom surface of the recess F4r formed in the fourth fin-type patterns F4 by a second height h2. The second height h2 may be greater than a height h2' by which the upper surface of the third source/drain E3 is spaced apart from the bottom surface of the recess F3r. However, exemplary embodiments are not limited to the example given above. The second height h2 may be between 35 nm and 55 nm. The second height h2 may be between 40 nm and 50 nm. The height h2' may be between 25 nm and 45 nm. The height h2' may be between 30 nm and 40 nm. For example, the ratio of h2 to h2' may be between 1.1:1 and 2:1. For example, the ratio of h2 to h2' may be between 1.2:1 and 1.5:1.

Next, another region of the semiconductor device according to some exemplary embodiments will be described with reference to FIGS. 7 and 8. Regions in FIGS. 7 to 8 may include a fifth fin-type pattern F5, a sixth fin-type pattern F6, first to sixth shallow trenches ST1"-ST6", first to third trenches T1"-T3", a first interlayer insulating film 20, a second interlayer insulating film 30, a ninth gate electrode 200", a tenth gate electrode 300", an eleventh gate electrode 201", a twelfth gate electrode 301", gate insulating films 130" and 140", a gate spacer 160", a fifth source/drain E5, a sixth source/drain E6, and so on.

The fifth region V and the sixth region VI may have similar structures with the third region III and the fourth region IV described above. However, a distance between the ninth gate electrode 200" and the tenth gate electrode 300" in the fifth region V, and a distance between the eleventh gate electrode 201" and the twelfth gate electrode 301" in the sixth region VI may be a third distance D3 that is greater than the second distance D2 in the third region III and the fourth region IV.

The ninth gate electrode 200" may include a ninth work function metal 210" and a ninth filling metal 220". The ninth work function metal 210" plays a role of adjusting a work function, and the ninth filling metal 220" plays a role of filling the space formed by the ninth work function metal 210". The ninth work function metal 210" may be, for example, an N-type work function metal, a P-type work function metal, or a combination thereof.

The tenth gate electrode 300" may include a tenth work function metal 310" and a tenth filling metal 320". The tenth work function metal 310" plays a role of adjusting a work function, and the tenth filling metal 320" plays a role of filling the space formed by the tenth work function metal 310". The tenth work function metal 310" may be, for example, an N-type work function metal, a P-type work function metal, or a combination thereof.

In some exemplary embodiments, the fifth region V may be a PMOS region, and therefore the ninth work function metal 210" and the tenth work function metal 310" may be a combination of an N-type work function metal and a P-type work function metal. For example, the ninth work function metal 210" and the tenth work function metal 310" may include at least one of TiN, WN, TiAl, TiAlN, TaN, TiC, TaC, TaCN, TaSiN, or a combination thereof, but not limited thereto. The ninth filling metal 220" and the tenth filling metal 320" may include, for example, at least one of W, Al, Cu, Co, Ti, Ta, poly-Si, SiGe, or a metal alloy, but not limited thereto.

The eleventh gate electrode 201" may include an eleventh work function metal 211" and an eleventh filling metal 221". The eleventh work function metal 211" plays a role of adjusting a work function, and the eleventh filling metal 221" plays a role of filling the space formed by the eleventh work function metal 211". The eleventh work function metal 211" may be, for example, an N-type work function metal, a P-type work function metal, or a combination thereof.

The twelfth gate electrode 301" may include a twelfth work function metal 311" and a twelfth filling metal 321". The twelfth work function metal 311" plays a role of adjusting a work function, and the twelfth filling metal 321" plays a role of filling the space formed by the twelfth work function metal 311". The twelfth work function metal 311" may be, for example, an N-type work function metal, a P-type work function metal, or a combination thereof.

In some exemplary embodiments, the sixth region VI may be an NMOS region, and therefore the eleventh work function metal 211" and the twelfth work function metal 311" may be an N-type work function metal. The eleventh work function metal 211" and the twelfth work function metal may include at least one of, for example, TiN, WN, TiAl, TiAlN, TaN, TiC, TaC, TaCN, TaSiN, or a combination thereof, but not limited thereto. The eleventh filling metal 221" and the twelfth filling metal 321" may include at least one of, for example, W, Al, Cu, Co, Ti, Ta, poly-Si, SiGe, or a metal alloy, but not limited thereto.

For example, the ninth gate electrode 200", the tenth gate electrode 300", the eleventh gate electrode 201", and the twelfth gate electrode 301" may be formed by a replacement process or a gate last process, but not limited thereto.

Fifth source/drains E5 may be formed on both sides of the ninth gate electrode 200" and the tenth gate electrode 300" in the first direction X, and on the respective fifth fin-type patterns F5. The fifth source/drains E5 may be source/drain regions of respective transistors on the fifth fin-type patterns F5.

Sixth source/drains E6 may be formed on both sides of the eleventh gate electrode 201" and of the twelfth gate electrode 301" in the first direction X, and on the sixth fin-type patterns F6, respectively. The sixth source/drains E6 may be source/drain regions of respective transistors on the sixth fin-type pattern F6.

The fifth source/drains E5 and the sixth source/drains E6 may include an epitaxial layer formed by epitaxy. For example, the fifth source/drains E5 and the sixth source/drains E6 may be raised source/drains. The fifth region V may be a PMOS region and the sixth region VI may be an NMOS region, and therefore the fifth source/drains E5 may be a SiGe epitaxial layer, for example. The sixth source/drains E6 may be a Si epitaxial layer, for example. At this time, the sixth source/drains E6 may include Si:P highly doped with phosphorus P.

The fifth source/drains E5 may fill a recess F5r of the fifth fin-type patterns F5. Likewise, the sixth source/drains E6 may fill a recess F6r of the sixth fin-type patterns F6.

FIG. 8 is a cross sectional view in a first direction X. Referring to FIG. 8, the fifth source/drains E5 in the fifth region V may be formed so as to fill the recess F5r formed on an upper surface of the fifth fin-type patterns F5. At this time, since the ninth gate electrode 200" and the tenth gate electrode 300" are formed in the portion in which no recess F5r is formed on the upper surface of the fifth fin-type patterns F5, the fifth source/drains E5 may be formed between the ninth gate electrode 200" and the tenth gate electrode 300".

The fifth source/drains E5 may have the same level of upper surface as the fifth fin-type patterns F5. For example, a height of an upper surface of the fifth source/drains E5 may be equal to a height of the upper surface of the fifth fin-type patterns F5. The upper surface of the fifth source/drains E5 may be flat. For example, a height of a highest point of the upper surface from a lowermost level of the upper surface may be less than 5 nm. A portion of the upper surface of the fifth source/drains E5 may be overlapped with a portion of the lower surface of the gate spacer 160". For example, a portion of the upper surface of the fifth source/drains E5 may be in contact with a portion of a lower surface of the gate spacer 160".

The sixth source/drains E6 in the sixth region VI may be formed so as to fill the recess formed on an upper surface of the sixth fin-type patterns F6. At this time, since the eleventh gate electrode 201" and the twelfth gate electrode 301" are formed in the portion in which no recess F6r is formed on the upper surface of the sixth fin-type patterns F6, the sixth source/drains E6 may be formed between the eleventh gate electrode 201" and the twelfth gate electrode 301".

The sixth source/drains E6 may have a higher upper surface than the sixth fin-type patterns F6. For example, a height of an upper surface of the sixth fin-type patterns F6 may be less than that of an upper surface of the sixth source/drains E6. The upper surface of the sixth source/drains E6 may include a concave portion CC. A portion of the upper surface of the sixth source/drains E6 may be overlapped with a portion of the lower surface of the gate spacer 160". For example, a portion of the upper surface of the fifth source/drains E6 may be in contact with a portion of a lower surface of the gate spacer 160".

The concave portion CC of the upper surface of the sixth source/drains E6 may be formed lower than a point where the sixth source/drains E6 and the gate spacers 160" meet. A first convex portion CV1 and a second convex portion CV2 may be formed on both sides of the concave portion CC. The first convex portion CV1 may be a point where one of the gate spacers 160" and one of the sixth source/drains E6 meet. However, exemplary embodiments are not limited to the example given above. The second convex portion CV2 may be spaced apart from a point where one of the gate spacers 160" and one of the sixth source/drains E6 meet, by a predetermined distance. However, exemplary embodiments are not limited to the example given above. For example, a position of the convex portion may or may not be a position contacting with the gate spacer 160".

The concave portion CC may be formed as high as a third height h3 from the bottom surface of the recess F6r formed in the sixth fin-type patterns F6. The third height may be greater than a height at which the upper surface of the fifth source/drains E5 is spaced apart from the bottom surface of the recess F5r. However, exemplary embodiments are not limited to the example given above. For example, the third height h3 may be between 20 nm and 40 nm. For example, the third height h3 may be between 25 nm and 35 nm.

A lowermost portion of an upper surface of the sixth source/drains E6 may be positioned higher than the sixth fin-type patterns F6. For example, the lowermost portion of the upper surface of the sixth source/drain E6 is a lowermost portion of the upper surface of the concave portion CC. The lowermost portion of the upper surface of the concave portion CC may be formed higher than the upper surface of the sixth fin-type pattern by a fourth height h4. For example, the fourth height h4 may be the difference between the height of the upper surface of the sixth fin-type pattern F6 and the height of the lowermost portion of the concave portion of the upper surface of the sixth source/drain E6. For example, the fourth height h4 may be less than 20 nm. For example, the fourth height h4 may be less than 10 nm. For example, h4 is less than 50% of h3. For example, h4 is less than 30% of h3.

Then, the first region I, the third region III, and the fifth region V will be compared with reference to FIG. 9, and the second region II, the fourth region IV, and the sixth region VI will be compared with reference to FIG. 10.

First, referring to FIG. 9, a first region I, a third region III, and a fifth region V of a semiconductor device according to some exemplary embodiments will be compared below.

In the first region I, the third region III, and the fifth region V, distances between gate electrodes may gradually increase. For example, a distance between the first gate electrode 200 and the second gate electrode 300 in the first region I may be a first distance D1, a distance between the fifth gate electrode 200' and the sixth gate electrode 300' in the third region III may be a second distance D2, and a distance between the ninth gate electrode 200" and the tenth gate electrode 300" in the fifth region V may be a third distance D3. The first distance D1 may be less than the second distance D2, and the second distance D2 may be less than the third distance D3.

As the distances between the gate electrodes in the first region I, the third region III, and the fifth region V are gradually increasing, a width of the third source/drains E3 may be greater than that of the first source/drains E1, and a width of the fifth source/drains E5 may be greater than that of the third source/drains E3. For example, the width of the upper surface of the third source/drain E3 in a cross-sectional view as shown in FIG. 6 may be between 30 nm and 60 nm. For example the width of the upper surface of the third source/drain E3 in the cross-sectional view may be between 40 nm and 50 nm. For example, the width of the upper surface of the fifth source/drain E5 in a cross-sectional view as shown in FIG. 8 may be between 50 nm and 120 nm. For example the width of the upper surface of the fifth source/drain E5 in the cross-sectional view may be between 65 nm and 85 nm.

On the contrary, heights of the upper surfaces of the first source/drains E1, the third source/drains E3, and the fifth source/drains E5 may be all equal. Each of the first region I, the third region III, and the fifth region V may be a PMOS region. Accordingly, the recesses F1r, F3r, and F5r may be completely filled over time because the first source/drains E1, the third source/drains E3, and the fifth source/drains E5 may include SiGe and grow completely saturated in (111) plane. Accordingly, the first source/drains E1, the third source/drains E3, and the fifth source/drains E5 may be all filled to the same heights.

Then, referring to FIG. 10, a second region II, a fourth region IV, and a sixth region VI of a semiconductor device according to some exemplary embodiments will be compared below.

In the second region II, the fourth region IV, and the sixth region VI, distances between gate electrodes may gradually increase. For example, a distance between the third gate electrode 201 and the fourth gate electrode 301 in the second region II may be a first distance D1, a distance between the seventh gate electrode 201' and the eighth gate electrode 301' in the fourth region IV may be a second distance D2, and a distance between the eleventh gate electrode 201" and the twelfth gate electrode 301" in the sixth region VI may be a third distance D3. The first distance D1 may be less than the second distance D2, and the second distance D2 may be less than the third distance D3.

As the distances between the gate electrodes in the second region II, the fourth region IV, and the sixth region VI are gradually increased, a width of the fourth source/drain E4 may be greater than that of the second source/drains E2, and a width of the sixth source/drains E6 may become greater than that of the fourth source/drains E4. For example, the width of the upper surface of the fourth source/drain E4 in a cross-sectional view as shown in FIG. 6 may be between 30 nm and 60 nm. For example the width of the upper surface of the fourth source/drain E4 in the cross-sectional view may be between 40 nm and 50 nm. For example, the width of the upper surface of the sixth source/drain E6 in a cross-sectional view as shown in FIG. 8 may be between 50 nm and 120 nm. For example the width of the upper surface of the sixth source/drain E6 in the cross-sectional view may be between 65 nm and 85 nm.

The upper surface of the second source/drains E2 may include a convex portion CV. The upper surface of the fourth source/drains E4 may be flat. For example, a height of a highest point of the upper surface from a lowermost level of the upper surface may be less than 5 nm. The upper surface of the sixth source/drains E6 may include a concave portion CC. For example, as the distances between the gate electrodes are increased, a shape of the upper surface of the source/drains may be changed from upward facing convex to downward facing convex.

This may be occurred because an epitaxial growth rate of Si:P doped with phosphorus P in high concentration is varied according to a distance (i.e., an open space) between the gate electrodes. The epitaxial growth may have a different rate according to a direction of a growth plane. For example, (100) plane direction may have the highest growth rate, and (110) plane direction may have the second highest growth rate. The growth rate may be the slowest in (111) plane direction in which the (100) plane and (110) plane meet.

When the bottom surfaces of the recesses F2r, F4r and F6r are formed flat, the upper surface of the source/drains may be formed flat according to the growth rate in (100) plane of the bottom surface, the growth rate in (110) plane of the side surface, and the growth rate in (111) plane as an overlapping portion in which (110) plane of the side surface of (100) plane of the bottom surface meets. For example, each of the flat bottom surfaces of the recesses F2r, F4r and F6r may have a roughness that a height of a highest point of the bottom surface from a lowermost level of the bottom surface may be less than 5 nm.

In certain embodiments, the bottom surfaces of the recesses F2r, F4r and F6r may not be flat, and there are not many pure (100) planes. In certain embodiments, at least two of (100) plane, (110) plane, and (111) plane are overlapped with each other, a distribution of the growth rate may be varied according to planes of the recesses F2r, F4r and F6r. Accordingly, a shape of the source/drains may vary in an NMOS region. For example, the growth rate in the bottom surface may be decreased. Accordingly, the growth rate of the side surface may be relatively increased.

In certain embodiments, although the epitaxial growth starts at surfaces of bottom surface and side surface, atoms of Si are diffused along a sidewall of an insulating film. For example, an epitaxial growth of Si may be greater on the sidewall of the recesses F2r, F4r and F6r connected with the sidewall of the insulating film than an epitaxial growth of Si on the bottom surface of the recesses F2r, F4r and F6r.

For example, when distances of the gate electrodes are gradually increased from the first distance D1 to the second distance D2, and then to the third distance D3, it may cause a change of shapes of the source/drains in the NMOS region.

For example, when a distance of the gate electrodes is short, the upper surface of the second source/drains E2 may include a convex portion CV like the second region II. For example, when a distance of the gate electrodes becomes a bit greater, the upper surface of the fourth source/drains E4 may become flat like the fourth region IV. For example, a height of a highest point of an upper surface of a fourth source/drain E4 from a lowermost level of the upper surface of the fourth source/drain may be less than 5 nm. Also at this time, according to reasons described above, a plurality of fourth source/drains E4 may be a non-finite form, and may have an irregular shape. For example, the fourth source/drains E4 may not be flat, and have an upper surface including fine curves. For example, the upper surface of the fourth source/drains E4 may have an uneven surface.

When a distance between the gate electrodes increase, the upper surface of the sixth source/drains E6 may include a concave portion CC like the sixth region VI. For example, because the epitaxial growth of the source/drains E6 happens more in sidewall of the recess F6r, a resultant shape may be concaved in the center. For example, an epitaxial growth of the source/drains E6 may be faster than an epitaxial growth in sidewalls of the recess F6r, and the upper surface of the source/drains E6 may have a concave shape. This may be a shape resulted according to a method for fabricating a semiconductor device having operating characteristics of high efficiency in the NMOS region including high concentration of phosphorus P. While the concave portion CC may be formed in the center of the sixth source/drains E6, the first convex portion CV1 and the second convex portion CV2, which are relatively convex, may be formed in both sides of the concave portion CC.

For example, the center of the upper surface of a source/drain may be lower than side portions of the upper surface of the source/drain. The side portions of the upper surface may be portions that an upper surface of the source/drain contacts gate spacers. The side portions of the upper surface may be portions in the midway between the center of the upper surface of the source/drain and the point that the upper surface contacts gate spacers. In certain embodiments, the side portions of the upper surface may be the points that the upper surface of the source/drain contacts the gate surfaces. The upper surface of the source/drain may be a boundary surface that the source/drain contact a second interlayer insulating film 30 described above.

For example, a depth of the concave portion CC may be a vertical distance between the lowest point of the upper surface of the concave portion CC of the sixth source/drain E6 and the highest point of the convex portions CV1 and CV2 of the sixth source/drain E6. The depth of the concave portion CC may be less than 50 nm. For example, the depth of the concave portion CC may be less than 30 nm. For example, a height of the sixth source/drain may be a vertical distance between the lowermost point of the lower surface of the sixth source/drain E6 and the highest point of the convex portions CV1 and CV2. The height of the sixth source/drain E6 may be between 35 nm and 100 nm. For example, the height of the sixth source/drain E6 may be between 40 nm and 70 nm. For example the depth of the concave portion CC of the sixth source/drain E6 may be between 10% and 60% of the height of the sixth source/drain E6. For example, the depth of the concave portion CC of the sixth source/drain E6 may be between 10% and 45% of the height of the sixth source/drain E6. For example, the depth of the concave portion CC of the sixth source/drain E6 may be between 15% and 30% of the height of the sixth source/drain E6.

The heights may be all equal. For example, each of the first region I, the third region III, and the fifth region V may be a PMOS region. For example, the recesses F1r, F3r, and F5r may be completely filled over time because the first source/drains E1, the third source/drains E3, and the fifth source/drains E5 include SiGe and grow completely saturated in (111) plane. For example, the first source/drains E1, the third source/drains E3, and the fifth source/drains E5 may be all filled to the same heights.

Hereinbelow, a semiconductor device according to some exemplary embodiments will be described with reference to FIGS. 1 and 11. Elements or operations overlapping with some exemplary embodiments described above will be mentioned as briefly as possible or omitted for the sake of brevity.

Figure 11:
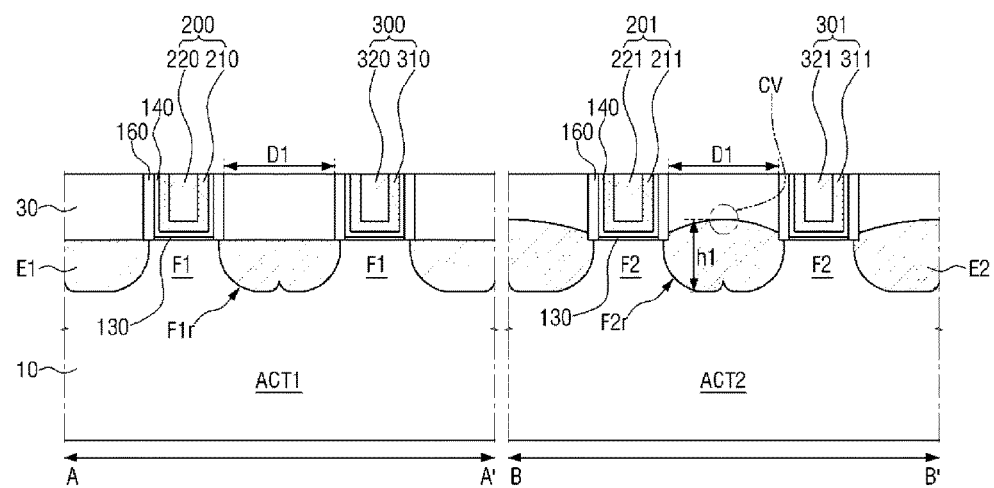
FIG. 11 are cross sectional views provided to explain a semiconductor device according to some exemplary embodiments.

FIG. 11 is cross sectional views provided to explain a semiconductor device according to some exemplary embodiments. FIG. 11 is cross sectional views taken on lines A-A' and B-B' of FIG. 1.

Referring to FIGS. 1 and 11, lower portions of a recess F1r and a source/drain E1 of the semiconductor device according to some exemplary embodiments may be in a U-shape in the first region I. For example, the lower portion of the first source/drain E1 may not be formed flat, but formed in a shape in which curves are overlapped in a cross-sectional view. The lower portion of the first source/drain E1 may have a shape that curved surfaces are overlapped. For example, in the case of PMOS as described above, even when the lower portion of the recess F1r is not flat such that the growth rate of the epitaxial growth is varied according to the planes, over time, the first source/drain E1 may be formed in the form that completely fills the recess F1r.

For example, each of the lower portions of the recess F1r and the source/drain E1 may be a lower portion of a boundary surface that the source/drain contacts the substrate 10 described above. These expressions may be applied similarly to lower portions of the other recesses and source/drains in the current disclosure. The top surface of a source/drain in a PMOS region may be flat when the bottom surface of the source/drain is either flat or uneven. For example, a height of a highest point of the top surface from a lowermost level of the top surface may be less than 5 nm. The top surface of a source/drain may be a boundary surface that the source/drain contacts a second interlayer insulating film 30 described above. The bottom surface of the source/drain may be a boundary surface that the source/drain contacts the substrate 10 described above.

The lower portions of the recess F2r and a second source/drain E2 may be in a U-shape in the second region II. For example, the lower portion of the second source/drain E2 may not be formed flat, but formed in a shape in which curves are overlapped in a cross-sectional view. As described above, because phosphorus P is doped with high concentration in the NMOS unlike the PMOS and the growth rate of the planes overlapped each other are different, a shape of the epitaxial growth layer may be irregular. For example, the upper surface of the second source/drain E2 may be irregular.

Although not illustrated, the recesses F3r-F6r in the third to sixth regions III-VI may also have the U-shaped lower portion like recesses F1r and F2r in FIG. 11.

Hereinbelow, a semiconductor device according to some exemplary embodiments will be described with reference to FIGS. 7 and 12. Elements or operations overlapping with some exemplary embodiments described above will be mentioned as briefly as possible or omitted for the sake of brevity.

Figure 12:
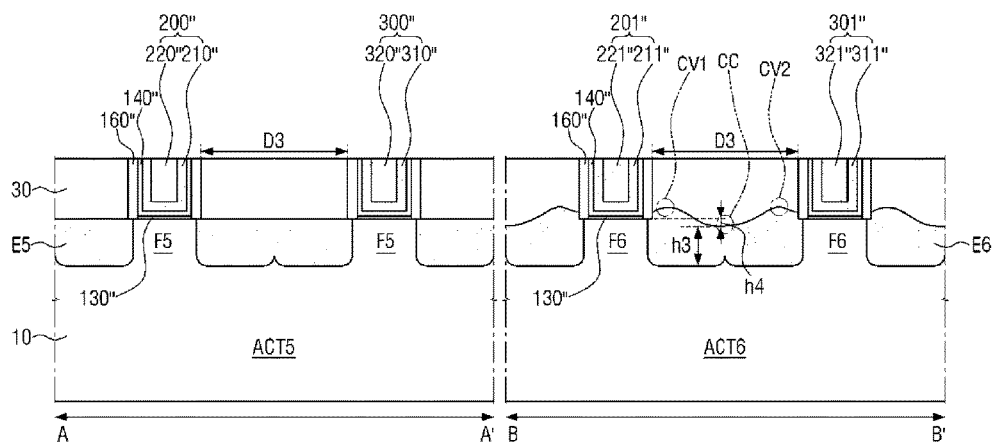
FIG. 12 are cross sectional views provided to explain a semiconductor device according to some exemplary embodiments.

FIG. 12 is cross sectional views provided to explain a semiconductor device according to some exemplary embodiments. FIG. 12 is cross sectional views taken on lines A-A' and B-B' of FIG. 7.

Referring to FIGS. 7 and 12, a lowermost portion of the concave portion CC of the upper surface of a sixth source/drain E6 of the semiconductor device according to some exemplary embodiments may be positioned lower than the upper surface of the sixth fin-type pattern F6. For example, the upper surface of the sixth fin-type pattern F6 may be located higher than the lowermost portion of the concave portion CC by a fourth height h4. For example, the fourth height h4 may be the difference between the height of the upper surface of sixth fin-type pattern F6 and the height of the lowermost portion of the concave portion of the upper surface of the sixth source/drain E6. For example, the fourth height h4 may be less than 20 nm. For example, the fourth height h4 may be less than 10 nm. For example, h4 is less than 50% of h3. For example, h4 is less than 30% of h3. For example, the upper surface of the sixth fin-type pattern F6 may be a boundary surface that the sixth fin-type pattern F6 contacts the gate insulating film 130. This expression may also be applied to other upper surfaces of fin-type patterns described in the current disclosure.

As a distance between the eleventh gate electrode 201" and the twelfth gate electrode 301" increases by the third distance D3, the concave portion CC of the upper surface of the sixth portion/drain E6 may be lowered further than the upper surface of the sixth fin-type pattern F6. For example, the distance between the eleventh gate electrode 201" and the twelfth gate electrode 301" may be a third distance D3, and the concave portion CC of the upper surface of the sixth portion/drain E6 may be lower than the upper surface of the sixth fin-type pattern F6.

Hereinbelow, a semiconductor device according to some exemplary embodiments will be described with reference to FIGS. 1 and 13. Elements or operations overlapping with some exemplary embodiments described above will be mentioned as briefly as possible or omitted for the sake of brevity.

Figure 13:
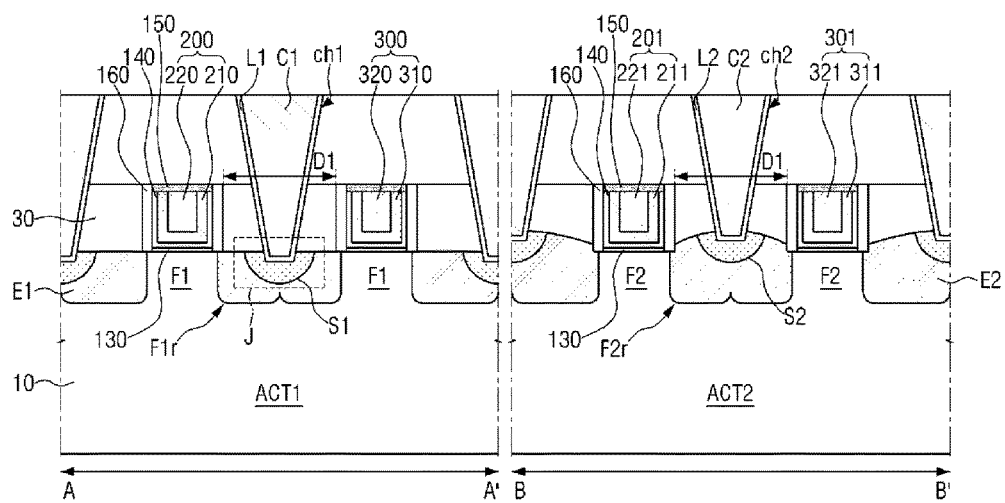
FIG. 13 are cross sectional views provided to explain a semiconductor device according to some exemplary embodiments.

FIG. 13 is cross sectional views provided to explain a semiconductor device according to some exemplary embodiments.

Referring to FIG. 13, the semiconductor device according to some exemplary embodiments may include a capping film 150, and a first silicide S1 and a second silicide S2 on a first source/drain E1 and a second source/drain E2, respectively.

The capping film 150 may be formed on the high-k dielectric film 140 and the first gate electrode 200. For example, the capping film 150 may include SiN. The capping film 150 may be in contact with an inner wall of the gate spacer 160. The upper surface of the capping film 150 may be on a same level as the upper surface of the gate spacer 160, but not limited thereto. The upper surface of the capping film 150 may be higher than the upper surface of the gate spacer 160.

The first and second silicides S1 and S2 may be formed on the first source/drain E1 and the second source/drain E2. The silicides S1 and S2 may be formed as a portion of each of the first source/drain E1 and the second source/drain E2. For example, the silicides S1 and S2 may be formed by a modification of the first and second source/drains E1 and E2. The silicides S1 and S2 may include a metal. The metal may include, for example, at least one of Ni, Co, Pt, Ti, W, Hf, Yb, Tb, Dy, Er, Pd, and a metal alloy thereof.

Contact holes ch1 and ch2 may pass through the second interlayer insulating film 30 and the third interlayer insulating film 40 to expose at least a portion of the first and second silicides S1 and S2. Barrier layers L1 and L2 may be formed conformally along a side surface and a bottom surface of the contact holes ch1 and ch2, and contacts C1 and C2 may be formed on the barrier layers L1 and L2 to fill the contact holes ch1 and ch2.

In this case, the first source/drain E1 and the second source/drain E2 may include a protrusion protruded from the substrate 10. For example, the protrusion may protrude from the surface of the first fin-type patterns F1 and the second fin-type patterns F2 to surround both sides of the first and second silicides S1 and S2. For example, the silicides S1 and S2 may be surrounded by the first and second source/drains E1 and E2 respectively in a plane view. For example, the outer most surface of the first and second silicides S1 and S2 are in contact with the first and second source/drains E1 and E2 in a plane view.

As illustrated in FIG. 13, the protrusion may be in such a shape having decreasing width with an increasing distance from the surface of the substrate 10.

For example, the protrusion may be in such a shape surrounding at least ½ of the vertical length of the first and second silicides S1 and S2 in a cross-sectional view. In the drawings, the protrusion is illustrated as a shape surrounding the entire side surface of the first and second silicides S1 and S2, but not limited thereto.

For example, in at least a portion of the surface of the first source/drain E1 and the second source/drain E2, the first and second silicides S1 and S2 may not be formed. For example, as illustrated in FIG. 13, in regions between the first and second silicides S1 and S2 and the first to fourth gate electrodes 200, 300, 201 and 301, there may be non-silicided surfaces of the first source/drain E1 and the second source/drain E2 in a plane view or a cross-sectional view.

As illustrated in FIG. 13, each of the first and second silicides S1 and S2 may be a reversed cone type. For example, a narrow tip region may be positioned downward (towards to the substrate 10), and the bottom surface may be positioned becoming wider upward (opposite direction to the substrate 10). The tip region may be a lowermost point or region of each of the silicides S1 and S2 in a cross-sectional view. For example, since each of the first and second silicides S1 and S2 may have a structure in which the lower portion is narrow and becomes wider as it goes upward, the side surface may be inclined to a predetermined angle θ. The predetermined angle may be for example, 30° to 70°, but not limited thereto. More specifically, the predetermined angle may be 40° or more and 60°, but not limited thereto. The angles of the side surfaces may be an average angel with respect to a horizontal plane. The horizontal plane may be parallel with an extending surface of the substrate 10.

For example, tip regions of the first and second silicides S1 and S2 may be located higher than a surface of the substrate 10. By doing this, it is helpful to achieve enough channel length of a transistor, and improve operating characteristic of the transistor.

The first silicide S1 may be formed on the first source/drain E1. For example, the upper surface of the first silicide S1 may be flat. For example, a height of a highest point of the upper surface of the first silicide S1 from a lowermost level of the upper surface of the first silicide S1 may be less than 5 nm. However, a recess may be formed in a portion of the first silicide S1. The first contact C1 and the first barrier layer L1 may be formed in the recessed portion of the first silicide S1. For example, the upper surface of the first silicide S1 may be flat by the first source/drain E1 except a portion in which the first contact C1 and the first barrier layer L1 are formed.

For example, the upper surface of the first silicide S1 may be flat except the portion which the first contact C and the first barrier layer L1 are formed on. In certain embodiments, the first silicide S1 may be formed on a flat surface of the first source/drain E1. For example, the top surface of the first source/drain E1 may be flat. In certain embodiments, the first silicide S1 may be embedded in the first source/drain E1 that has a flat top surface, and may share a top surface with the first source/drain E1. For example, the top surfaces of the first silicide S1 and the first source/drain E1 are in the same level.

A first contact hole ch1 may be formed in a part of the upper portion of the first silicide S1. For example, the recess may be formed in the part of the upper portion of the first silicide S1. The recess may be in a rectangle shape as illustrated in FIG. 13. However, exemplary embodiments are not limited to the example given above.

The second silicide S2 may be formed on the second source/drain E2. For example, the upper surface of the second silicide S2 may be convex upward. However, a recess may be formed in a portion of the second silicide S2. The second contact C2 and the second barrier layer L2 are formed in the second silicide S2. For example, the upper surface of the second silicide S2 may be convex upward by the second source/drain E2 except a portion in which the second contact C2 and the second barrier layer L2 are formed.

For example, the upper surface of the second silicide S2 may protrude upward except the portion which the second contact C and the second barrier layer L1 are formed on. For example, a center portion of the top surface of the second silicide S2 is higher than an edge portion of the top surface of the second silicide S2 in a cross-sectional view. In certain embodiments, the second silicide S2 may be formed on a protruding surface of the second source/drain E2. For example, the top surface of the second source/drain E2 may protrude upward. For example, a center portion of the top surface of the second source/drain E2 may be higher than an edge portion of the top surface of the second source/drain E2. In certain embodiments, the second silicide S2 may be embedded in the second source/drain E2 which has a protruding top surface.

A second contact hole ch2 may be formed in a part of the upper portion of the second silicide S2. For example, the recess may be formed in the part of the upper portion of the second silicide S2. The recess may be in a rectangle shape as illustrated in FIG. 13. However, exemplary embodiments are not limited to the example given above.

Hereinbelow, a semiconductor device according to some exemplary embodiments will be described with reference to FIGS. 1, 13 and 14. Elements or operations overlapping with some exemplary embodiments described above will be mentioned as briefly as possible or omitted for the sake of brevity.

Figure 14:
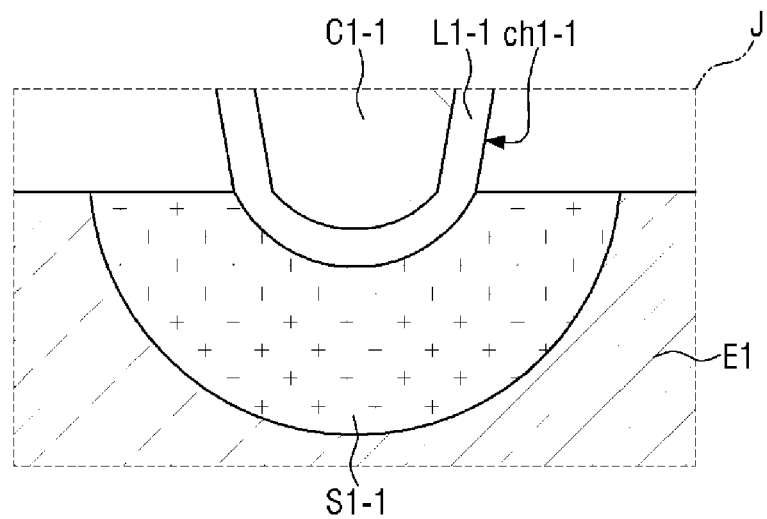
FIG. 14 is an enlarged cross sectional view provided to explain a semiconductor device according to some exemplary embodiments.

FIG. 14 is an enlarged cross sectional view provided to explain a semiconductor device according to some exemplary embodiments. FIG. 14 is an enlarged cross sectional view showing an example embodiment having a different structure from the embodiment of FIG. 13 in the rectangularly indicated section J of FIG. 13.

Referring to FIG. 14, a first silicide S1-1 may be formed on the first source/drain E1. The first silicide S1-1 may be formed as an upper portion of the first source/drain E1 is changed. For example, the first silicide S1-1 may be embedded in an upper portion of the first source/drain E1 having a flat top surface. A lower portion of the first silicide S1-1 may be in a U-shape. However, exemplary embodiments are not limited to any specific example. Accordingly, various shapes may be contemplated depending on silicidation process. A first contact hole ch1-1 may be formed on the upper portion of the first silicide S1-1. The first contact hole ch1-1 may pass through the second interlayer insulating film 30, and be formed by etching a part of the upper portion of the first silicide S1-1.

An upper portion of the first silicide S1-1 may include a recess. A shape of the recess may be a U-shape as illustrated in FIG. 14. However, embodiments are not limited to any of the examples given above. Various shapes may be possible according to silicide process and a material of the first source/drain E1.

Hereinbelow, a semiconductor device according to some exemplary embodiments will be described with reference to FIGS. 1, 13 and 15. Elements or operations overlapping with some exemplary embodiments described above will be mentioned as briefly as possible or omitted for the sake of brevity.

Figure 15:
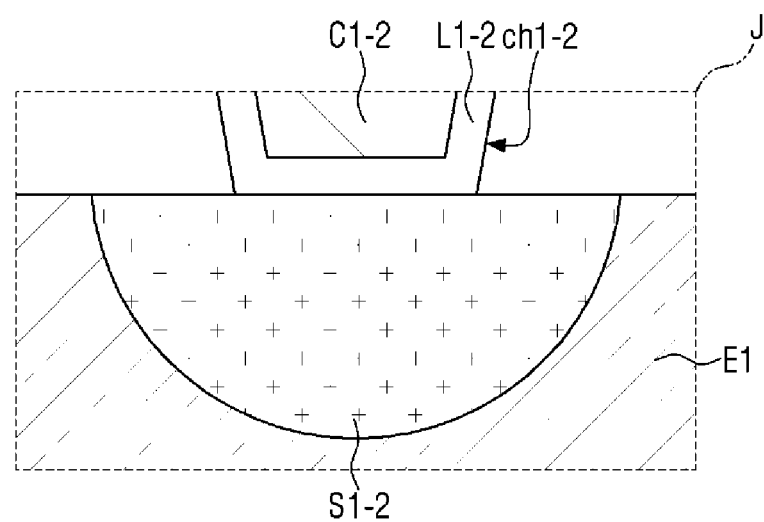
FIG. 15 is an enlarged cross sectional view provided to explain a semiconductor device according to some exemplary embodiments.

FIG. 15 is an enlarged cross sectional view provided to explain a semiconductor device according to some exemplary embodiments. FIG. 15 is an enlarged cross sectional view showing an example embodiment having a different structure form the embodiment shown in FIG. 13 in the rectangularly indicated section J of FIG. 13.

Referring to FIG. 15, a first silicide S1-2 may be formed on the first source/drain E1. The first silicide S1-2 may be formed as an upper portion of the first source/drain E1 is changed. For example, the first silicide S1-2 may be embedded in an upper portion of the first source/drain E1 having a flat top surface. For example, a flat surface described in this disclosure may have a height of a highest point of the surface from a lowermost level of the surface may be less than 5 nm. A lower portion of the first silicide S1-2 may be in a U-shape. However, exemplary embodiments are not limited to any specific example. Accordingly, various shapes may be contemplated depending on silicidation process. A first contact hole ch1-2 may be formed on the upper portion of the first silicide S1-2. The first contact hole ch1-2 may pass through the second interlayer insulating film 30, and expose the upper surface of the first silicide S1-2.

The upper surface of the first silicide S1-2 may not be recessed by the first contact hole ch1-2. For example, the upper surface of the first silicide S1-2 may be formed flat. Bringing the first contact hole ch1-2 into a contact with the first silicide S1-2 may cause the first barrier layer L1-2 and the first contact C1-2 to be in contact with the first silicide S1-2. Accordingly, the upper surface of the first silicide S1-2 may maintain a flat shape.

Hereinbelow, a semiconductor device according to some exemplary embodiments will be described with reference to FIGS. 1, 5, 7, and 16 to 19. Elements or operations overlapping with some exemplary embodiments described above will be mentioned as briefly as possible or omitted for the sake of brevity.

Figure 16:
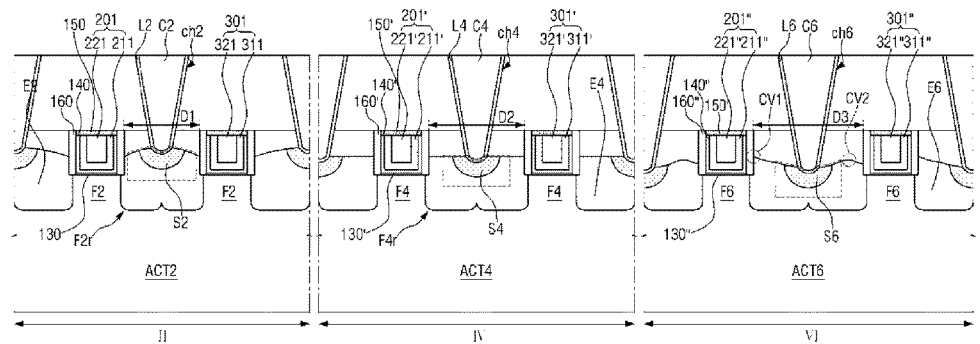
FIG. 16 are cross sectional views provided to explain a semiconductor device according to some exemplary embodiments.
Figure 17:
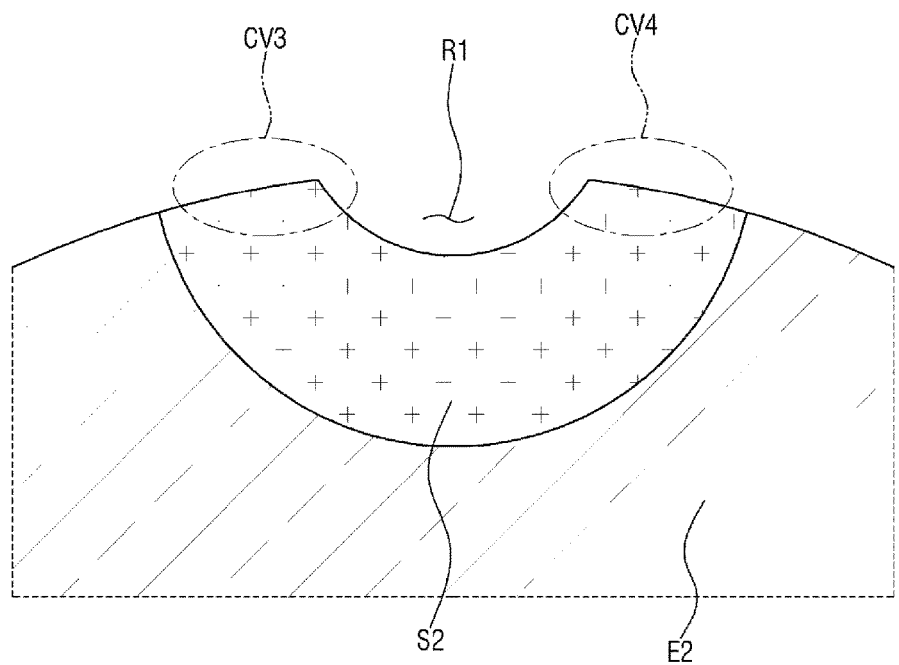
FIG. 17 is an enlarged view provided to explain a shape of the silicide in the second region of FIG. 16.
Figure 18:
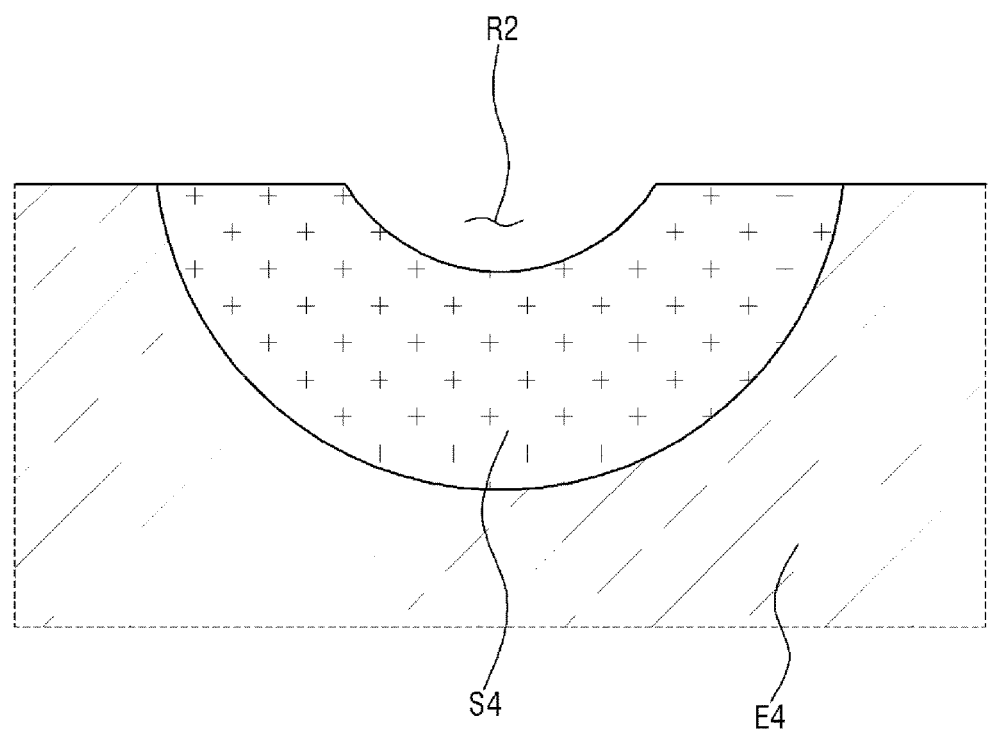
FIG. 18 is an enlarged view provided to explain a shape of the silicide in the fourth region of FIG. 16.
Figure 19:
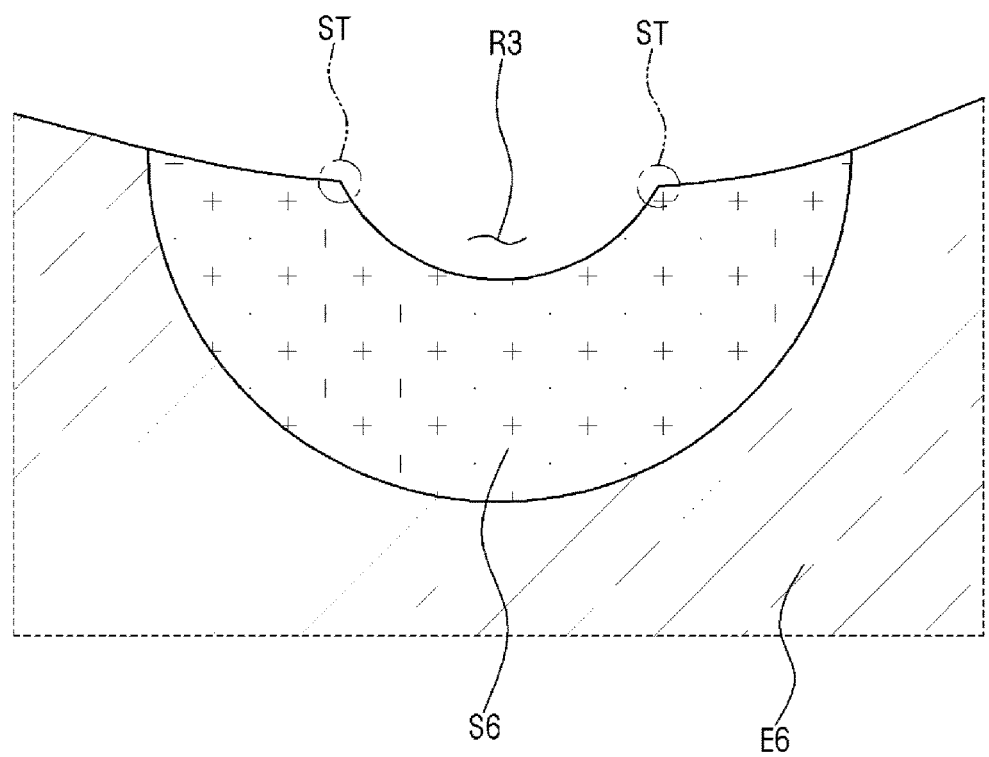
FIG. 19 is an enlarged view provided to explain a shape of the silicide in the sixth region of FIG. 16.

FIG. 16 is a cross sectional view provided to explain a semiconductor device according to some exemplary embodiments, and FIG. 17 is an enlarged view provided to explain a shape of the silicide in the second region of FIG. 16. FIG. 18 is an enlarged view provided to explain a shape of the silicide in the fourth region of FIG. 16, and FIG. 19 is an enlarged view provided to explain a shape of the silicide in the sixth region of FIG. 16. FIG. 16 is a cross sectional view take on B-B' of FIGS. 1, 5 and 7, and FIGS. 17 to 19 are enlarged views of the silicide of FIG. 16, in which illustration of the contacts C2-C6 and the barrier layers L2-L6 is omitted for convenience.

Referring to FIGS. 1, 5, 7, and 16 to 19, the semiconductor devices according to some exemplary embodiments include the second silicide S2, the fourth silicide S4, the sixth silicide S6, contact holes ch2-ch6, barrier layers L2-L6, and contacts C2-C6.

First, referring to FIGS. 16 and 17, the second silicide S2 in the second region II may include the first recess R1, the third convex portion CV3 and the fourth convex portion CV4. Since the upper surface of the second source/drain E2 is formed convexly upward, the upper surface of the second silicide S2 except the first recess R1 may be in a convexly upward shape.

The first recess R1 may be a portion in which the second contact hole ch2 is formed. For example, the first recess R1 may be a location where the second barrier layer L2 and the second contact hole C2 are formed.

For example, the third convex portion CV3 and the fourth convex portion CV4 may be formed on both sides of the first recess R1. The third convex portion CV3 and the fourth convex portion CV4 may be formed by a formation of the first recess R1 as the upper surface of the second source/drain E2 is convex.

Next, referring to FIGS. 16 and 18, the fourth silicide S4 in the fourth region IV may include the second recess R2. Since the upper surface of the fourth source/drain E4 is formed in flat shape, the upper surface of the fourth silicide S4 may be in a flat shape except the second recess R2.

The second recess R2 may be a portion in which the fourth contact hole ch4 is formed. For example, the second recess R2 may be a location where the fourth barrier layer L4 and the fourth contact hole C4 are formed.

Referring to FIGS. 16 and 19, the sixth silicide S6 in the sixth region VI may include the third recess R3 and two stepped portions ST. Since the upper surface of the sixth source/drain E6 is formed convexly downward, the upper surface of the sixth silicide S6 including the third recess R3 may be in a convexly-downward shape.

The third recess R3 may be a portion in which the sixth contact hole ch6 is formed. For example, the third recess R3 may be a location where the sixth barrier layer L6 and the sixth contact C6 are formed.

For example, the stepped portion ST may be formed on both sides of the third recess R3. The stepped portion ST may be a portion in which a slope is sharply changed by the third recess R3. For example, a stepped portion may be formed because, while the upper surface of the sixth source/drain E6 is convex downward, a slope of the third recess R3 is more sharply convex downward. However, exemplary embodiments are not limited to any specific example. For example, the sixth contact C6 and the sixth barrier layer L6 may also be formed without recess.

Figure 20:
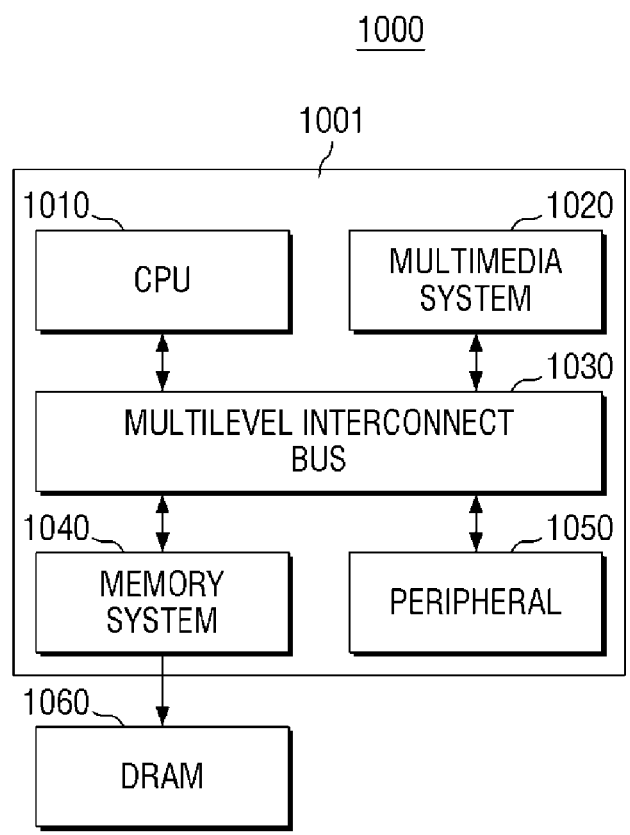
FIG. 20 is a block diagram of a system-on-chip (SoC) system including a semiconductor device according to a semiconductor device fabricating method according to exemplary embodiments.

FIG. 20 is a block diagram of a SoC system including a semiconductor device according to exemplary embodiments.

Referring to FIG. 20, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operation necessary for driving of the SoC system 1000. In some exemplary embodiments, the CPU 1010 may be configured on a multi-core environment which includes a plurality of cores.

The multimedia system 1020 may be used for performing a variety of multimedia functions on the SoC system 1000. The multimedia system 1020 may include a 3D engine module, a video codec, a display system, a camera system, a post-processor, or the like.

The bus 1030 may be used for exchanging data communication among the CPU 1010, the multimedia system 1020, the memory system 1040 and the peripheral circuit 1050. In some exemplary embodiments of the present disclosure, the bus 1030 may have a multi-layer structure. For example, the bus 1030 may be a multi-layer advanced high-performance bus (AHB), or a multi-layer advanced eXtensible interface (AXI), although exemplary embodiments are not limited herein.

The memory system 1040 may provide environments necessary for the application processor 1001 to connect to an external memory (e.g., DRAM 1060) and perform high-rate operation. In some exemplary embodiments of the present disclosure, the memory system 1040 may include a separate controller (e.g., DRAM controller) to control an external memory (e.g., DRAM 1060).

The peripheral circuit 1050 may provide environments necessary for the SoC system 1000 to have a seamless connection to an external device (e.g., main board). For example, the peripheral circuit 1050 may include a variety of interfaces to allow compatible operation with the external device connected to the SoC system 1000.

The DRAM 1060 may function as an operation memory necessary for the operation of the application processor 1001. In some exemplary embodiments, the DRAM 1060 may be disposed externally to the application processor 1001, as illustrated in FIG. 20. For example, the DRAM 1060 may be packaged into a package on package (PoP) type with the application processor 1001.

At least one of the above-mentioned components of the SoC system 1000 may include at least one of the semiconductor devices according to the exemplary embodiments explained above.

Figure 21:
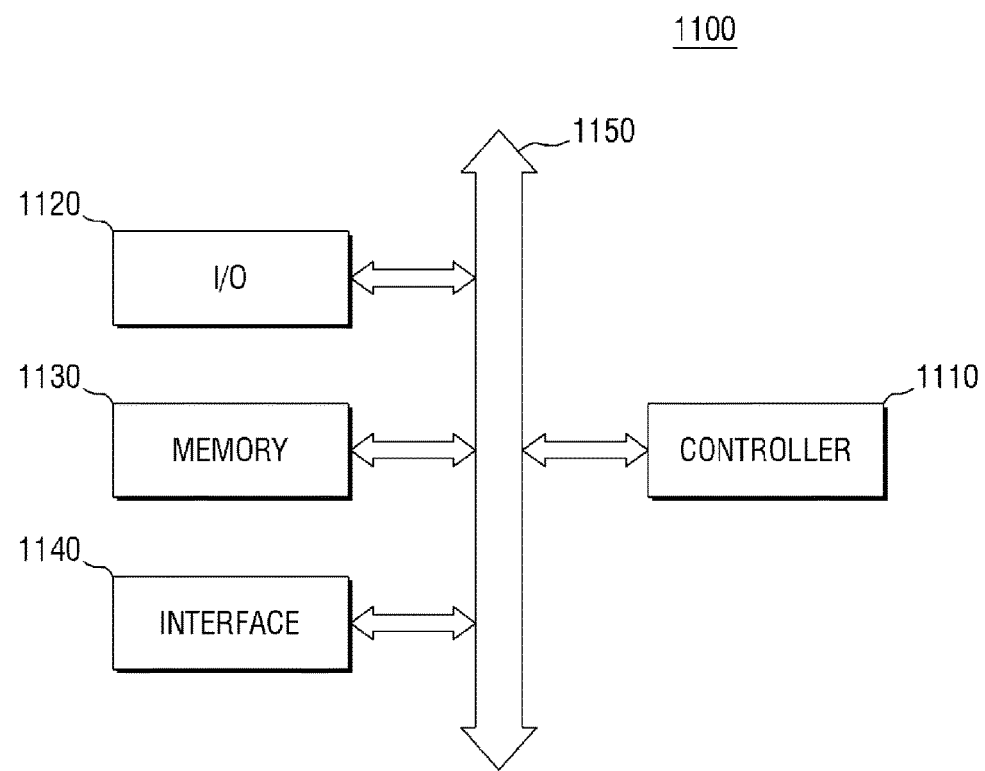
FIG. 21 is a block diagram of an electronic system including a semiconductor device according to a semiconductor device fabricating method according to exemplary embodiments.

FIG. 21 is a block diagram of an electronic system including a semiconductor device according to exemplary embodiments.

Referring to FIG. 21, the electronic system 1100 according to an exemplary embodiment may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of microprocessor, digital signal processor, micro controller, and logic devices capable of performing functions similar to the functions of those mentioned above. The I/O device 1120 may include a keypad, a keyboard, a display device, and so on. The memory device 1130 may store data and/or instructions, and so on. The interface 1140 may perform a function of transmitting or receiving data to or from communication networks. The interface 1140 may be in a wired or wireless form. For example, the interface 1140 may include an antenna or a wired/wireless transceiver.

Although not illustrated, the electronic system 1100 may additionally include an operation memory configured to enhance operation of the controller 1110, such as a high-rate dynamic random access memory (DRAM) and/or a static random access memory (SRAM).

A semiconductor device according to one of the exemplary embodiments described above may be provided within the memory device 1130, or provided as a part of the controller 1110, the I/O device 1120, and so on.

The electronic system 1100 is applicable to a personal digital assistant (PDA) portable computer, a web tablet, a wireless phone, a mobile phone, a digital music player, a memory card, or almost all electronic products capable of transmitting and/or receiving data in wireless environment.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device, comprising:
   a substrate comprising first to third regions;
   first to third gate electrodes formed in the first to third regions, respectively;
   a first epitaxial source/drain formed on either side of the first gate electrode;
   a second epitaxial source/drain formed on either side of the second gate electrode; and
   a third epitaxial source/drain formed on either side of the third gate electrode,
   wherein a width of the first epitaxial source/drain is less than that of the second epitaxial source/drain,
   a width of the second epitaxial source/drain is less than that of the third epitaxial source/drain,
   an upper surface of the first epitaxial source/drain is higher than an upper surface of the second epitaxial source/drain, and
   an upper surface of the second epitaxial source/drain is higher than an upper surface of the third epitaxial source/drain.

2. The semiconductor device of claim 1, wherein the upper surface of the first epitaxial source/drain comprises a convex portion.

3. The semiconductor device of claim 1, wherein the upper surface of the third epitaxial source/drain comprises a concave portion.

4. The semiconductor device of claim 1, wherein the upper surface of the second epitaxial source/drain is flat.

5. The semiconductor device of claim 1, wherein the substrate further comprises fourth to sixth regions, and the semiconductor device further comprises:
   fourth to sixth gate electrodes formed on the fourth to sixth regions, respectively;
   a fourth epitaxial source/drain formed on either side of the fourth gate electrode;
   a fifth epitaxial source/drain formed on either side of the fifth gate electrode; and
   a sixth epitaxial source/drain formed on either side of the sixth gate electrode,
   wherein a width of the fourth epitaxial source/drain is less than that of the fifth epitaxial source/drain,
   a width of the fifth epitaxial source/drain is less than that of the sixth epitaxial source/drain, and
   heights of upper surfaces of the fourth to sixth epitaxial source/drains are equal to each other.

6. The semiconductor device of claim 5, wherein the fourth to sixth regions are PMOS regions.

7. The semiconductor device of claim 5, wherein heights of upper surfaces of the fourth to sixth epitaxial source/drains are equal to an upper surface of the substrate.

8. The semiconductor device of claim 1, wherein the first to third epitaxial source/drains include P.

9. The semiconductor device of claim 1, wherein the first to third regions are NMOS regions.

* * * * *